(12) United States Patent
Chua-Eoan et al.

(10) Patent No.: US 8,497,694 B2
(45) Date of Patent: Jul. 30, 2013

(54) ON-CHIP SENSOR FOR MEASURING DYNAMIC POWER SUPPLY NOISE OF THE SEMICONDUCTOR CHIP

(75) Inventors: Lew Chua-Eoan, San Diego, CA (US); Boris Andreev, San Diego, CA (US); Christopher Phan, San Diego, CA (US); Amirali Shayan, San Diego, CA (US); Xiaohua Kong, San Diego, CA (US); Mikhail Popovich, San Diego, CA (US); Mauricio Calle, San Diego, CA (US); IK-Joon Chang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 396 days.

(21) Appl. No.: 12/703,233

(22) Filed: Feb. 10, 2010

(65) Prior Publication Data

US 2011/0193589 A1 Aug. 11, 2011

(51) Int. Cl.
*G01R 31/36* (2006.01)
*G01R 31/3187* (2006.01)

(52) U.S. Cl.
USPC .................................. 324/750.15; 324/750.3

(58) Field of Classification Search
None
See application file for complete search history.

(56) References Cited

U.S. PATENT DOCUMENTS

| | | | |
|---|---|---|---|
| 6,255,879 B1 * | 7/2001 | Voss | 327/276 |
| 7,355,435 B2 * | 4/2008 | Ferraiolo et al. | 324/750.3 |
| 7,365,548 B2 * | 4/2008 | Neuman | 324/613 |
| 7,394,273 B2 * | 7/2008 | Hsu et al. | 324/750.3 |
| 7,646,208 B2 * | 1/2010 | Ferraiolo et al. | 324/764.01 |
| 7,675,339 B2 * | 3/2010 | Lim et al. | 327/262 |
| 7,688,098 B2 * | 3/2010 | Kajita | 324/750.3 |
| 7,948,228 B2 * | 5/2011 | Takemoto et al. | 324/76.11 |
| 7,952,370 B2 * | 5/2011 | Ferraiolo et al. | 324/750.3 |
| 2006/0214672 A1 * | 9/2006 | Jenkins et al. | 324/713 |
| 2007/0007970 A1 | 1/2007 | Neuman | |
| 2008/0007272 A1 * | 1/2008 | Ferraiolo et al. | 324/617 |
| 2008/0129325 A1 * | 6/2008 | Ferraiolo et al. | 324/765 |
| 2008/0265931 A1 * | 10/2008 | Hsu et al. | 324/763 |
| 2008/0288196 A1 * | 11/2008 | Singh et al. | 324/76.11 |
| 2010/0109700 A1 * | 5/2010 | Ferraiolo et al. | 324/771 |

OTHER PUBLICATIONS

International Search Report and Written Opinion—PCT/US2011/024228—ISA/EPO—Apr. 6, 2011.
Muhtargolu A, et al., "On-Die droop detector for Analog Sensing of power supply Noise", IEEE Journal of Solid-State Circuits, IEEE Service Center, Picatsway, NJ,USA,vol. 39, No. 4, Apr. 1, 2004 pp. 651-660, XP011109682, ISSN:0018-9200, DOI:10.1109/JSSC.2004.825120 p. 651-p. 653.

(Continued)

*Primary Examiner* — Jermele M Hollington
(74) *Attorney, Agent, or Firm* — Sam Talpalatsky; Nicholas J. Pauley; Joseph Agusta

(57) ABSTRACT

An on-chip sensor measures dynamic power supply noise, such as voltage droop, on a semiconductor chip. In-situ logic is employed, which is sensitive to noise present on the power supply of functional logic of the chip. Exemplary functional logic includes a microprocessor, adder, and/or other functional logic of the chip. The in-situ logic performs some operation, and the amount of time required for performing that operation (i.e., the operational delay) is sensitive to noise present on the power supply. Thus, by evaluating the operational delay of the in-situ logic, the amount of noise present on the power supply can be measured.

24 Claims, 17 Drawing Sheets

OTHER PUBLICATIONS

Alon et al., "Circuits and Techniques for High-Resolution Measurement of On-Chip Power Supply Noise", IEEE Journal of Solid-State Circuits, vol. 40, No. 4, Apr. 2005.

Kanno et al., "In-Situ Measurement of Supply-Noise Maps With Millivolt Accuracy and Nanosecond-Order Time Resoultion", IEEE Journal of Solid-State Circuits, vol. 42, No. 4, Apr. 2007.

003 Nagata et al., "A Built-in Technique for Probing Power Supply and Ground Noise Distribution Within Large-Scale Digital Integrated Circuits", IEEE Journal of Solid-State Circuits, vol. 40, No. 4, Apr. 2005.

Rabaey, J.M.: "Digital Integrated Circuits, A Design Perspective," Prentice Hall Electronics and VLSI Series, Prentice Hall, Upper Saddle River, New Jersey 07458 (1996).

* cited by examiner

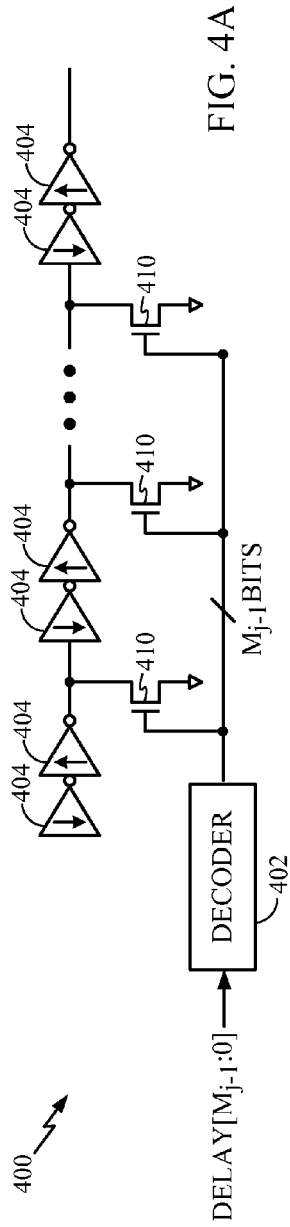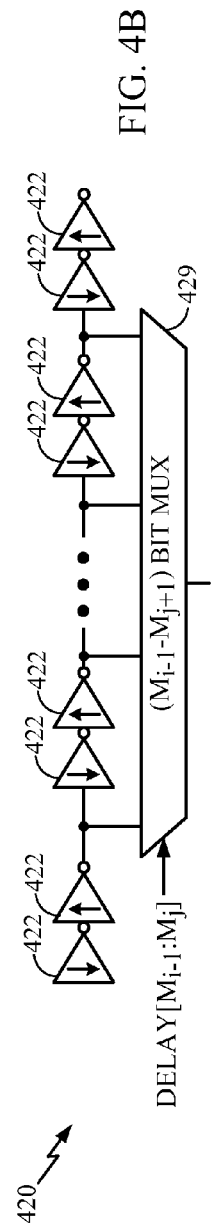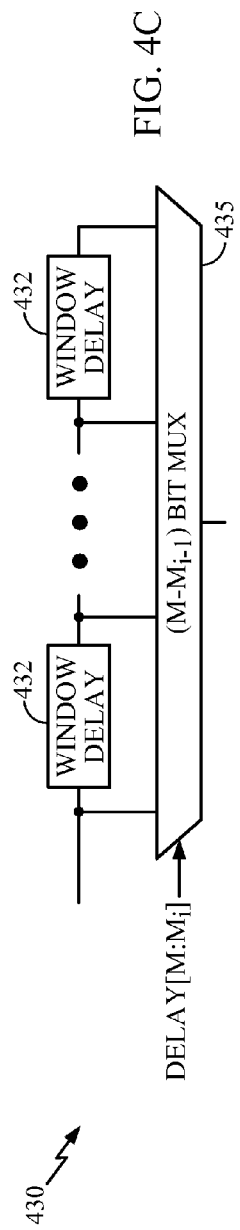
FIG. 4A
FIG. 4B
FIG. 4C

700

VDD_PRB (NOISY BLOCK POWER)

| Delay [M:0] | ... | 0.995 | ... |
|---|---|---|---|
| ⋮ | ⋮ | ⋮ | ⋮ |
| 59 | ⋮ | 0 | ⋮ |
| 60 | ⋮ | 1 | ⋮ |
| 61 | ⋮ | 5 | ⋮ |
| 62 | ⋮ | 41 | ⋮ |
| 63 | ⋮ | 51 | ⋮ |
| 64 | ⋮ | 2 | ⋮ |
| 65 | ⋮ | 37 | ⋮ |
| 66 | ⋮ | 58 | ⋮ |
| ⋮ | ⋮ | ⋮ | ⋮ |

1st Window: rows 61–63 (REMOVAL)
2nd Window: rows 64–66

| $V_{DD}$ | Delay [M:0] |
|---|---|
| ⋮ | ⋮ |
| 1.125 | n |
| 1.115 | m |
| ⋮ | ⋮ |

FIG. 7B

ON-CHIP SENSOR FOR MEASURING DYNAMIC POWER SUPPLY NOISE OF THE SEMICONDUCTOR CHIP

TECHNICAL FIELD

The following description relates generally to voltage sensors, and more particularly to an on-chip sensor for detecting dynamic power supply noise, such as voltage droop, encountered during operation of a semiconductor chip.

BACKGROUND

Power supply noise in integrated circuits (ICs) (wherein the terms "IC," "chips," "semiconductor chips" are used synonymously throughout this specification) has emerged as a critical issue, particularly in sub-100 nanometer (nm) technology. Power supply noise causes fluctuations in the voltage differences between power supply and ground rails within ICs resulting in unpredictable timing violations or logical event failures. Certain design flows that manage power supply noise rely on power analysis tools based on highly capable, fast transistor-level or abstracted gate-level simulations. How accurately such simulations can predict noises in terms of amplitudes, timings, and locations within a circuit, however, is largely unknown to designers. On-chip measurements of power supply and ground noise waveforms within ICs can provide valuable knowledge for establishing reliable design guides of power supply systems.

Chip designs are becoming increasingly complex as the number of devices implemented on a single chip are increasing. For example, IC designs commonly implement multi-core processors and system-on-chip (SoC) packages. Power supply noise can significantly alter the performance of these ICs. For instance, parasitic effects, such as interconnect resistance, increasingly impact the performance of ICs as technology sizes shrink. Parasitic effects have greatly increased design complexity due to ad hoc work arounds.

Power supply integrity is an important consideration for achieving higher performance of ICs. Degradation of the power integrity causes a voltage droop, which in turn causes unpredictable timing violations or logical event failures. As higher performing ICs are operating in ever lower power thresholds, highly-accurate analysis of a chip's power supply network is desired to improve power integrity.

One type of power supply noise is voltage droop. Transistors in the IC switch on and off millions of times each second. Turning on many transistors simultaneously uses a significant amount of current. When a large current is drawn from the power source, the voltage of the power source falls. This "voltage droop" occurs momentarily until the power source compensates or some of the transistors turn off. A droop of only tenths of a volt can have drastic effects on the operation of transistors in the IC. Monitoring the voltage droop is desirable because effects of voltage droop may be compensated for to prevent a negative impact on IC performance.

Various techniques for monitoring or measuring power supply noise, such as voltage droop, have been developed. Conventionally, these techniques have been analog in nature. That is, the techniques generally require use of analog circuits such as op-amps.

Other proposed measurement techniques are off-chip techniques that employ measurement logic implemented external to the chip. Such measurement techniques that are undesirable because of their inaccuracy. For example, potential changes or additional capacitances introduced by coupling the off-chip measurement circuitry to the portions of the chip being measured may alter the measurement.

One conventional on-chip technique employs a ring oscillator for measuring power supply noise. Ring oscillator speed varies with IC conditions, but the ring oscillator is unable to detect whether the change is due to voltage variation or some other IC condition, such as temperature variation.

BRIEF SUMMARY

The present disclosure is directed to systems and methods which employ an on-chip sensor for measuring dynamic power supply noise for the chip. That is, embodiments of an on-chip sensor are provided for measuring dynamic power supply noise, such as voltage droop, on the chip. As discussed further herein, embodiments of the disclosure employ in-situ logic that is sensitive to noise present on a power supply of functional logic of the chip, such as a microprocessor, adder, and/or other functional logic of the chip. For instance, in certain embodiments, the in-situ logic shares a common power supply with the chip's functional logic. The in-situ logic performs some operation, and the amount of time required for performing that operation (i.e., the operational delay) is sensitive to noise present on the power supply. Thus, by evaluating the operational delay of the in-situ logic, the amount of noise present on the power supply can be measured. Further, as discussed below, the operation of the in-situ logic can be controllably triggered at different times (e.g., using a delayed clock signal) relative to operation of the functional logic, thereby determining a power supply noise profile that is experienced at different points of the functional logic's operation.

The functional logic of the chip operates with reference to a reference clock signal. A delayed clock signal is generated, which is delayed by a predefined "delta" amount relative to the reference clock signal, and the delayed clock signal is supplied to the in-situ logic. While the functional logic of the chip performs its normal operation with reference to the reference clock signal, the in-situ logic performs some operation with reference to the delayed clock signal, wherein the operation of the in-situ logic generates an output signal. In one embodiment, the in-situ logic (which may be referred to herein as a "probe") comprises a series of inverters, which perform a series of inversion operations, such as inverting the received delayed clock signal, to produce an output signal.

The output signal from the in-situ logic is used to evaluate the delay of the operation of the in-situ logic. For instance, in one embodiment the delayed clock signal and the output signal from the in-situ logic are input to a pulse generator, which generates a pulse having a width that reflects the length of operational delay of the in-situ logic. Because the operation of the in-situ logic shares the power of the functional logic and is based on a delayed clock that has a predefined delay relative to the reference clock, the operational delay of the in-situ logic (e.g., the width of the pulse generated by the pulse generator) contains information regarding dynamic power supply noise on the power rail supplied to the functional logic, such as voltage droop information. As discussed below, certain embodiments employ a statistical approach for evaluating this information in order to determine a behavioral profile for dynamic power supply noise encountered during normal operation of the functional logic.

As is well known, many operations of digital circuits are triggered based on a reference clock signal. For instance, many gates/logic perform some operation based on a rising edge or falling edge of a cycle of a reference clock signal. Accordingly, dynamic power supply noise for the circuitry is often present around the rising or falling edges of the reference clock signal. It becomes desirable to capture the periodic repeatable behavior of the noise for the circuitry. Once this dynamic power supply noise behavioral profile is known, certain actions may be implemented for compensating for the noise (e.g., detected voltage droop), such as by throttling the clock frequency or increasing the regulator voltage to compensate for the associated droop, in order to prevent the noise from negatively impacting the chip's performance.

According to embodiments of the present disclosure, an on-chip sensor is proposed for capturing the dynamic power supply noise behavior for the chip. The chip has functional logic for performing the operations for the target application of the chip, and sensor logic that is added on the chip for monitoring the dynamic power supply noise of the chip. In this way, the on-chip sensor logic can monitor the dynamic power supply noise of the chip to determine a behavioral profile for the power supply noise that can be used for maintaining accurate performance of the functional logic.

In certain embodiments, the on-chip solution includes a clean power portion and a noisy power portion. The noisy power portion is a portion that includes the functional logic of the chip for which the sensor is implemented to monitor the dynamic power supply noise behavior. Such functional logic may be a microprocessor, an adder, and/or other functional logic of a given chip. Also, an in-situ logic (or "probe") portion is included in the noisy power portion of the chip, and thus shares the power supply of the functional logic of the noisy power portion. The clean power portion may provide a separate power supply (clean power and ground lines) for use by certain logic of the on-chip sensor solution, such as a delayed clock generator, a pulse generator, and a sensor for sensing/evaluating the pulses from the pulse generator. That is, the clean power supply is disconnected from the noisy power supply of the chip's functional logic. The clean power portion provides a separate power signal from the noisy power signal supplied to the functional logic of the chip such that the added logic to which the clean power supply is provided does not effect the behavior of the functional logic's noisy power supply and vice-versa. In certain implementations, to avoid incurring extra pin overhead, power lines of other power islands may be utilized for the clean power supply.

During operation, the functional logic functions as normal, such as it would for an intended application. For instance, a microprocessor in the noisy power portion may execute instructions of a given software application. As is normal, the functional logic (e.g., microprocessor) performs its operations with reference to a reference clock signal. A separate delayed clock signal, having some controlled delay amount (or "delta") relative to the reference clock signal, is supplied to the in-situ probe portion. The in-situ probe portion performs some operation based on the delayed clock signal, and returns an output signal. In one embodiment, the in-situ probe portion has a series of inverters to generate an inverted delay signal. As is discussed further herein, in one embodiment stacked inverters are employed to improve the sensitivity of the in-situ probe's operational delay to voltage fluctuation. In one exemplary embodiment, five stacked inverters are employed for the in-situ probe. Since the probing portion implemented in this manner consumes a small area, it can be efficiently embedded into standard library cell logic blocks.

In one embodiment, the delayed clock signal and the output signal from the in-situ probe portion are input to a pulse generator, which generates a pulse signal having a width equivalent to the delay of the in-situ probing portion (i.e., the delay for performing the operation, such as the series of inversions). Because the in-situ probe portion shares the noisy power supply of the functional logic and is operating at some delayed point relative to the reference clock signal of the functional logic, the operational delay of the in-situ probe portion has information regarding dynamic power supply noise (e.g., voltage droop) that is experienced by the functional logic. Thus, the dynamic power supply noise (e.g., voltage droop) can be sensed by measuring the generated pulse width information.

In one embodiment, a comparison delay block is used for comparison with the generated pulse for evaluating the width of the pulse. The comparison delay block may generate a signal representing a predefined amount of delay, wherein the amount of delay may, in certain embodiments, be controllable (e.g., via settings of control registers). In one embodiment, the total delay of the comparison delay block includes multiple variable delay blocks. In one embodiment, the total delay block is three variable delay blocks, which are referred to as "window selection," "coarse variable delay," and "fine variable delay" windows. Each of these parts of the delay may be controlled by control signals.

According to one embodiment, the output of the total delay block is used as a "D" signal of a D flip-flop, and the generated pulse signal is employed as the flip-flop's clock signal ("PLS_CLK"). When the delay of the total delay block is shorter than the generated pulse width, a "low" is captured at the rising edge of the flip-flop's clock signal. At the moment that the delay of the total delay block exceeds the generated pulse width, a "high" value is sensed in the flip-flop. Of course, while this implementation captures a low value (i.e., a logic 0) when the total delay block is shorter than the pulse width and captures a high value (i.e., a logic 1) when the total delay block exceeds the pulse width, other implementations may be configured in an opposite manner (i.e., to capture a 1 when the total delay block is shorter than the pulse width and a 0 when the total delay block exceeds the pulse width). In either implementation, different values are employed to distinguish between instances in which the total delay block is shorter than the pulse width and instances in which the total delay block exceeds the pulse width.

In an ideal situation, the captured value is always the same when the generated pulse width and the comparison delay is constant. However, this cannot be guaranteed in a real silicon operational environment due to circuit uncertainty, such as jitter. Moreover, pulse width cannot be constant since voltage droop generally changes every clock cycle. To cope with these issues, a statistical method is employed in certain embodiments. For instance, in certain embodiments, by counting the "high" value of the flip-flop output over multiple clock cycles, a cumulative distribution function (CDF) of voltage droop (rather than real voltage droop value) is obtained. If desired to differentiate with respect to delay, the CDF can be used to derive a probabilistic distribution function (PDF) of the dynamic power supply noise encountered by the functional logic of the chip.

As discussed further herein, in one embodiment, an on-chip voltage sensor for measuring voltage fluctuation in dynamic power supply of the chip is provided. The on-chip voltage sensor includes an offset delay element that generates a delayed clock signal that is delayed by an amount of time relative to an internal reference clock signal of the chip. The on-chip voltage sensor further includes a probe circuit that receives the delayed clock signal and generates an output signal. An amount of operational delay of the probe circuit in generating the output signal corresponds to voltage fluctuations on a power supply rail of the chip. Further, the on-chip voltage sensor includes a sensor that compares the operational delay of the probe circuit in generating the output signal with a reference signal to determine voltage fluctuation present on the power supply rail during performance of the operation to generate the output signal.

In one embodiment, an integrated circuit (IC) has functional logic that performs operations with reference to a reference clock signal (CLK). The IC also has an in-situ probe that receives a delayed clock signal. The delayed clock signal is delayed by an amount of time relative to the reference clock signal. The in-situ probe performs an operation (e.g., inversion of the received delayed clock signal) to generate an output signal. Also, the in-situ probe shares a common power supply with the functional logic of the chip. The IC also includes a pulse generator that receives the delayed clock signal and the output signal of the in-situ probe. The pulse generator generates a pulse signal that corresponds to operational delay of the in-situ probe in generating the output signal. And, the IC has a sensor that receives the pulse signal and evaluates width of the received pulse signal for determining a corresponding dynamic power supply noise fluctuation that was experienced by the functional logic during performance of the operation of the in-situ probe.

In one embodiment, a method includes receiving, by a digital probe arranged on an integrated circuit, a delayed clock signal. The delayed clock signal is delayed by an amount of time relative to a reference clock signal that is referenced for operation of functional logic included on the integrated circuit. And, the digital probe shares a common power supply with the functional logic. Responsive to the received delayed clock signal, the digital generates an output signal. Logic (e.g., a pulse generator) on the integrated circuit forms a signal that corresponds to operational delay of the digital probe in performing the operation to generate the output signal. And, logic (e.g., a sensor) on the integrated circuit evaluates the formed signal for measuring a corresponding dynamic power supply noise fluctuation that was experienced by the functional logic during performance of the operation by the digital probe.

As described above, the in-situ probing portion of certain embodiments contains voltage droop information. To use only digital input/output (I/O), this delay is to be converted to a digital signal. In certain embodiments, the delay is changed to a control signal of the variable delay block. Variable delay is increased with control signal incrementally. When the probing portion delay is matched to the delay of the variable delay, the control signal can be read. In this way, the probing delay can be converted to a digital signal efficiently.

Also, although clean power is used for the proposed sensor, jitter is unavoidable. In certain embodiments, statistical values are used instead of actual voltage drop. Inside the sensor, counters are embedded, which count the sensed number during a certain period. By dividing the sensed number by the clock cycle of the measurement period, the probability is obtained.

According to certain embodiments, a sensor is provided that can be implemented in a relatively small area such that it can be efficiently embedded in a standard cell logic block. Also, in certain embodiments, a sensor is provided that employs fully digital signals as I/O signals, which means that the sensor is robust to aliasing noise of the output pad. Further, in certain embodiments, statistical methods are employed to overcome jitter and circuit uncertainty.

According to one aspect of the disclosure, an on-chip voltage sensor for measuring voltage fluctuation in dynamic power supply of a chip includes an offset delay element that generates a delayed clock signal that is delayed by an amount of time relative to an internal reference clock signal of the chip. The voltage sensor also includes a probe circuit that receives the delayed clock signal and generates an output signal. An amount of operational delay of the probe circuit in generating the output signal corresponds to voltage fluctuations on a power supply rail of the chip. The voltage sensor further includes a sensor that compares the operational delay of the probe circuit in generating the output signal with a reference signal to determine voltage fluctuation present on the power supply rail during performance of the operation to generate the output signal.

According to another aspect of the disclosure, an integrated circuit includes functional logic that performs operations with reference to a reference clock signal. The integrated circuit also includes an in-situ probe that receives a delayed clock signal. The delayed clock signal delayed by an amount of time relative to the reference clock signal. The in-situ probe generates an output signal, wherein the in-situ probe shares a power supply with said functional logic. The integrated circuit further includes a pulse generator that receives the delayed clock signal and the output signal of the in-situ probe. The pulse generator generates a pulse signal that corresponds to operational delay of the in-situ probe in generating the output signal. The integrated circuit yet further includes a sensor that receives the pulse signal and evaluates width of the pulse signal for determining a corresponding dynamic power supply noise fluctuation that was experienced by the functional logic during performance of the operation of the in-situ probe.

According to yet another aspect of the disclosure, a method includes receiving, by a digital probe arranged on an integrated circuit, a delayed clock signal. The delayed clock signal delayed by an amount of time relative to a reference clock signal that is referenced for operation of functional logic included on the integrated circuit. The method also includes responsive to the delayed clock signal, performing an operation, by the digital probe, to generate an output signal. The operational delay of the digital probe in performing the operation to generate the output signal is sensitive to voltage fluctuation in a power supply of the functional logic included on the integrated circuit. The method further includes forming, by logic on the integrated circuit, a signal that corresponds to the operational delay of the digital probe in performing the operation to generate the output signal. The method also includes evaluating, by logic on the integrated circuit, a formed signal for measuring a corresponding voltage fluctuation that was experienced by the functional logic during performance of the operation by the digital probe.

According to a further aspect of the disclosure, a method includes the steps of receiving, by a digital probe arranged on an integrated circuit, a delayed clock signal. The delayed clock signal delayed by an amount of time relative to a reference clock signal that is referenced for operation of functional logic included on the integrated circuit. The method also includes the step of responsive to the delayed clock signal, performing an operation, by the digital probe, to generate an output signal. The operational delay of the digital probe in performing the operation to generate the output signal is sensitive to voltage fluctuation in a power supply of the functional logic included on the integrated circuit. The method further includes the step of forming, by logic on the integrated circuit, a signal that corresponds to the operational delay of the digital probe in performing the operation to generate the output signal. The method also includes evaluating, by logic on the integrated circuit, a formed signal for measuring a corresponding voltage fluctuation that was experienced by the functional logic during performance of the operation by the digital probe.

According to another aspect of the disclosure, an on-chip voltage sensor includes means for generating a delayed clock signal. The voltage sensor also includes means for probing the delayed clock signal coupled to a power supply rail. The voltage sensor further includes means for determining voltage fluctuation present on the power supply rail.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

FIG. 4A is a schematic illustrating an exemplary embodiment of a fine variable delay.

FIG. 4B is a schematic illustrating an exemplary embodiment of a coarse variable delay.

FIG. 4C is a schematic illustrating an exemplary embodiment of a window delay.

FIG. 7A is a table of outputs, obtained from a data collector during calibration, having broken proportionality.

FIG. 7B is a final measurement table, according to one embodiment.

DETAILED DESCRIPTION

Figure 1:
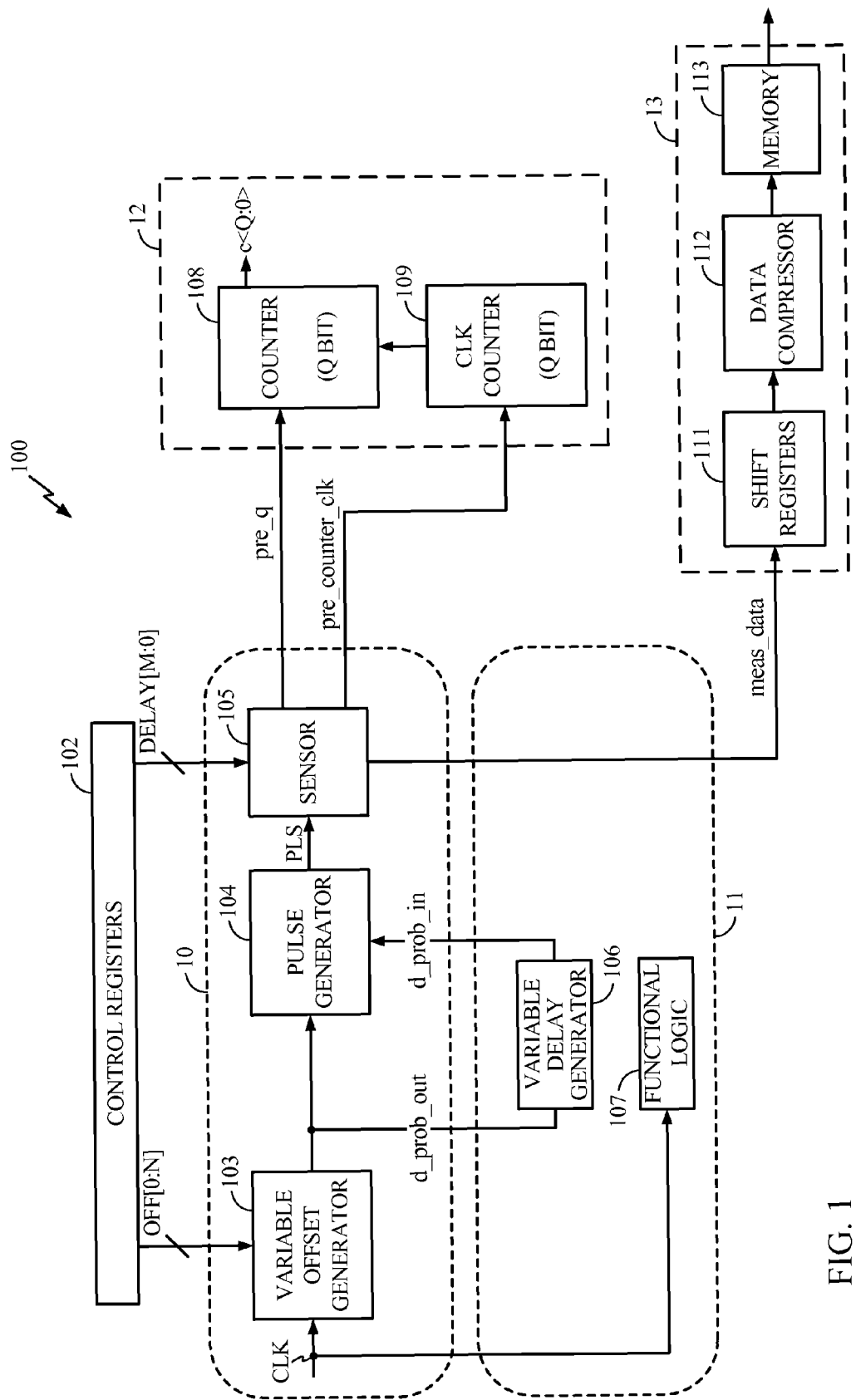
FIG. 1 is a block diagram illustrating an exemplary on-chip sensor according to one embodiment of the present disclosure.

FIG. 1 is a block diagram illustrating an exemplary on-chip sensor according to one embodiment of the present disclosure. In this example, an on-chip architecture 100 includes a clean power area 10 and a noisy power area 11. The noisy power area 11 includes the functional logic 107 of an integrated circuit. This may be, for example, a processor core or other logic circuitry in which dynamic power supply noise is measured by the on-chip sensor 100. The functional logic 107 introduces noise into the noisy power area 11 when transistors switch on and off causing voltage droop as described above. A variable delay generator 106 is included in the noisy power area 11 of the chip and shares power with the functional logic 107. As a result, the variable delay generator 106 is subject to the same power noise as the functional logic 107. The clean power area 10 includes separate power and ground lines (not shown) for use by a variable offset generator 103, a pulse generator 104, and a sensor 105. By providing separate ground and power lines for the clean power area 10, the noise introduced by the functional logic 107 is reduced or eliminated at the variable offset generator 103, the pulse generator 104, and the sensor 105.

A clock signal input, CLK, is coupled to the variable offset generator 103 and the functional logic 107. The clock signal, CLK, is offset by the variable offset generator 103 and output as an offset clock signal, d_prob_out. The offset clock signal, d_prob_out, has clock edges that occur after clock edges of the clock signal, CLK, by an offset amount, delta. In one embodiment, the amount of delta may be controlled by control registers 102 through a control signal having N number of bits, OFF[N:0]. The delayed clock signal, d_prob_out, is input to the variable delay generator 106. In one embodiment, the variable delay generator 106 includes a series of inverters to generate a delayed clock signal, d_prob_in. Clock edges of the delayed clock signal, d_prob_in, are delayed from the offset clock signal, d_prob_out, by a number of clock cycles proportional to the number of buffers in the variable delay generator 106 and the noise in the power supplied to the variable delay generator 106. In additional embodiments, the variable delay generator 106 may be used to generate multiple delays.

The offset clock signal, d_prob_out, from the variable offset generator 103 and the delayed clock signal, d_prob_in, from the variable delay generator 106 are input to the pulse generator 104, which generates a pulse signal, PLS, having a width proportional to the delay of the variable delay generator 106. The delayed clock signal, d-prob-in, is delayed by both a generated delay by inverters in the variable delay generator 106 and dynamic power noise occurring in the noisy power area 11. Therefore, the pulse signal, PLS, contains information regarding dynamic power noise present in the noisy power area 11.

The pulse signal, PLS, is input to the sensor 105, which evaluates the width of the pulse signal, PLS, for measuring the corresponding dynamic power supply noise (e.g., voltage droop) in the noisy power area 11. For instance, in one embodiment, the sensor 105 compares the pulse signal, PLS, width against a predefined table to correlate width to dynamic power supply noise (e.g., voltage droop). The width of the delay sensed by the sensor 105 (i.e., sensitivity of the sensor 105) may be controlled, in one embodiment, by the control registers 102, through delay lines having M number of bits, delay[M:0]. The sensor 105 outputs a first value (e.g., a 0) for each instance (e.g., each clock cycle) in which a comparison delay specified by the control registers 102 is shorter than the width of the pulse signal, PLS, and the sensor 105 outputs a second value (e.g., a 1) for each instance in which the comparison delay exceeds the width of the pulse signal, PLS.

Two embodiments for collecting data from the sensor 105 are shown, and either one or both may be included in the on-chip sensor 100. In the first embodiment, a first data collector 12 includes counters 108, 109. The width of the pulse signal, PLS, may be evaluated (e.g., compared against a comparison delay block) over multiple clock cycles. The counter 109 counts the number of clock cycles in a clock signal, pre_counter_clk, to determine when a desired sampling has been reached (e.g., a sampling of 63 cycles). The counter 108 counts the output of the sensor 105 to determine the number of instances in which the comparison delay exceeds the width of the pulse signal, PLS. Exemplary implementations of the counters 108 and 109 that may be employed are discussed in further detail below with reference to FIGS. 5A-5B. Although in certain implementations the sensor 105 and the counters 108, 109 may have significant overhead (e.g., 50 micrometers×70 micrometers), adjacent white space of the functional logic 107 may be used for their footprint.

In the case of a chip having multiple noisy power areas such as the noisy power area 11, one or more variable delay generators such as the variable delay generator 106 may be included in each noisy power area. This may allow for evaluating dynamic power supply noise at different locations and/or for different functional logic elements on a chip. Each of the variable delay generators may, according to one embodiment, share certain elements of the on-chip sensor 100. For example, the first data collector 12 may only appear once in a chip but be coupled to multiple sensors such as the sensor 105. Additionally, according to one embodiment, a sensor such as the sensor 105 may couple to multiple variable delay generators. Hence, the overall area penalty for implementing the on-chip sensor 100 may be reduced.

The first data collector 12 may be useful for recording quasi-periodic voltage fluctuations because it records fixed sampling cycles defined by the counter 109. In the event that non-periodic voltage fluctuation measurements are desired, an alternative collector may be implemented in addition to or instead of the first data collector 12 of the on-chip sensor 100. A second data collector 13 may be useful for recording non-periodic voltage fluctuations.

The second data collector 13 uses shift registers 111, a data compressor 112, and a memory 113 to measure and store power supply noise not synchronized with the clock signal, CLK. Operation of the on-chip sensor 100 with the second data collector 13 includes setting a pulse width level in the control registers 102. This level is used by the sensor 105 to determine if an input pulse signal, PLS, is more or less wide than the pulse width level set in the control registers 102. A first or second level (e.g., 0 or 1) is output on a measurement signal line, meas_data. The measurement signal, meas_data, indicates whether the power supply noise occurring in the noisy power area 11 dipped below a preset threshold. The measurements are stored in the shift registers 111. The measurement may then be compressed by a data compressor 112 and stored in the memory 113. The memory 113 may be read out for analysis of the power supply noise, recorded, or used to compensate the noise.

The second data collector 13 may be used to collect a large array of data by scanning multiple pulse width levels. For example, a first pulse width level may be set in the control registers 102 and measurements stored in the memory 113. Then, a second pulse width may be set in the control registers 102 and additional measurements stored in the memory 113. A reconstruction of this data will now be described below with reference to FIG. 1A.

Figure 1A:
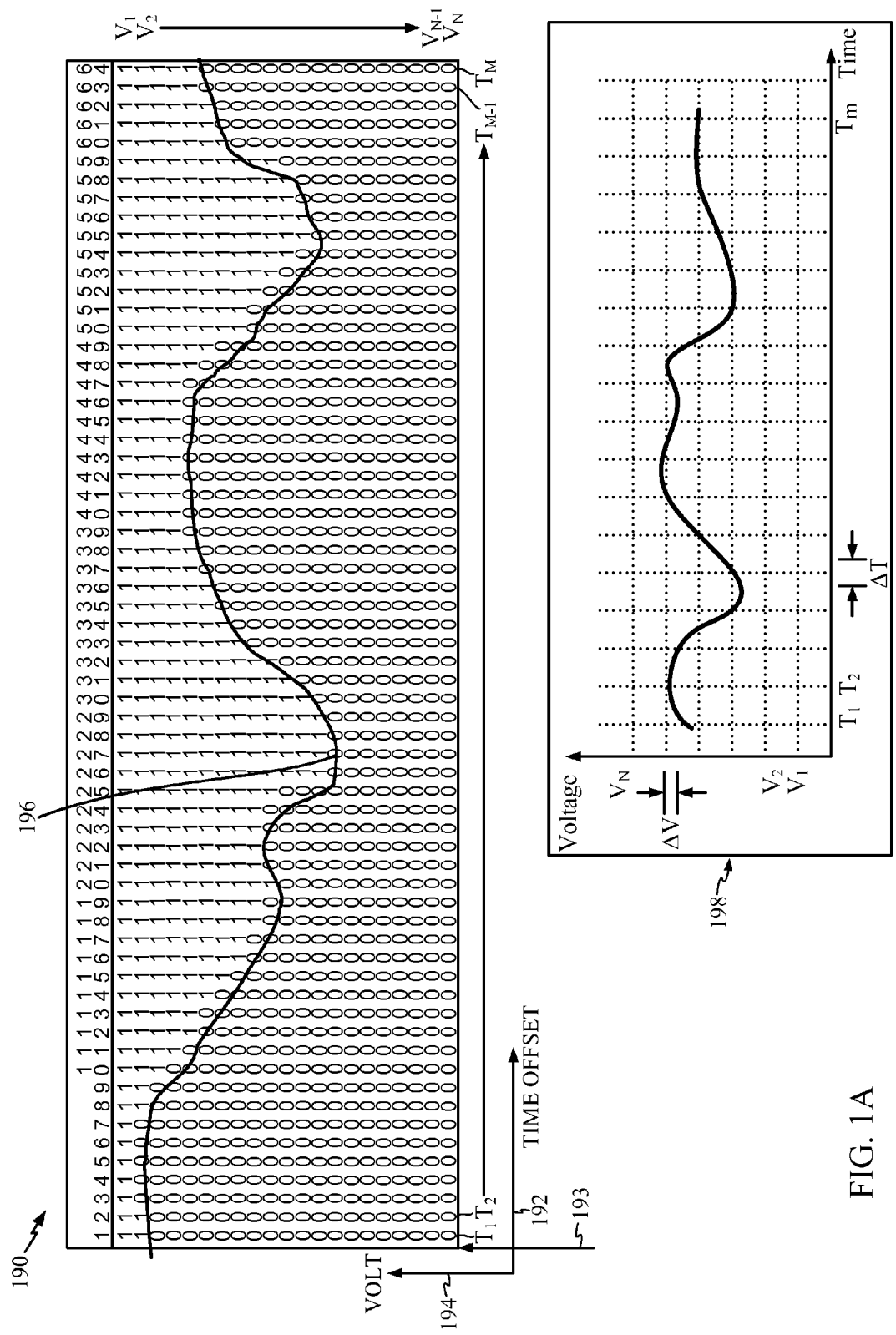
FIG. 1A is a table representing non-periodic data collected from an on-chip noise sensor according to one embodiment.

FIG. 1A is a table representing non-periodic data collected from an on-chip noise sensor according to one embodiment. A data table 190 may be collected by the second data collector 13 and stored in the memory 113. An axis 192 represents increasing delay offsets provided to the variable offset generator 103. An axis 194 represents a measured voltage that corresponds to a delay value used in the pulse variable delay 301 discussed below with respect to FIG. 3A. A time 193 is a time corresponding to a noise trigger event. As the time offset increases from the time 193, noise is being measured at times after the noise trigger event. As voltage increases along the axis 192, longer delays are tested that represent higher voltage values. By scanning offset values along the axis 192 and delay values corresponding to voltage values of the axis 194 in the on-chip sensor 100, a noise voltage waveform 196 may be generated. The noise voltage waveform 196 represents the dynamic power noise (e.g., voltage droop) experienced in the noisy power area 11. Each value in the data table 190 is shown as a 1 or 0; however, these values may alternatively be probabilistic values that are real numbers between 0 and 1 to increase accuracy. In the case that the values are probabilistic values, the values may be obtained from the first data collector 12. The resolution of voltage sampling in FIG. 1A is $\Delta V$, which is determined by the variable delay generator 106. The resolution of the sampling $\Delta T$ is determined by the frequency of a sampling clock. The resolution of sampling may be adjusted using a frequency divider as described below with reference to FIG. 12. A voltage range of the on-chip sensor 100 may be $V_1$ to $V_N$ and an observation window of the on-chip sensor 100 may be $T_1$ to $T_M$. The sampling rate in the observation window may be configurable in the on-chip sensor 100 or the observation window may be fixed. Also shown is a data table 198 representing another set of non-periodic data.

Ideally, the measurements stored in the memory 113 accurately represent measurements of the sensor 105. Uncertainty in the measurements, such as jitter, causes noise. Therefore, a statistical data collection method may be employed. For instance, in certain embodiments, the counters 108, 109 are used to count the instances of captured high values and/or low values over multiple clock cycles. By counting the values of the sensor 105 output over multiple clock cycles, a cumulative distribution function (CDF) of the dynamic power noise is obtained. If desired to differentiate with respect to delay, the CDF can be used to derive a probabilistic distribution function (PDF) of the dynamic power supply noise encountered by the functional logic 107 of the chip. With either a periodic noise event or a non-periodic noise event, a noise event triggered in the noisy power area 11 should be synchronous with the clock signal, CLK. If a random noise event occurs at the beginning of each sweep through delay values DELAY[M:0], neither the first data collector 12 nor the second data collector 13 will correctly record the triggered noise event.

As will be shown below with FIG. 11, the on-chip sensor 100 is not limited to probing a single noisy power area 11. For example, multiple on-chip sensors 100 may be built on a chip and used to probe multiple areas. According to one embodiment, the first data collector 12 and the second data collector 13 are shared across multiple probes on the same chip.

Figure 2:
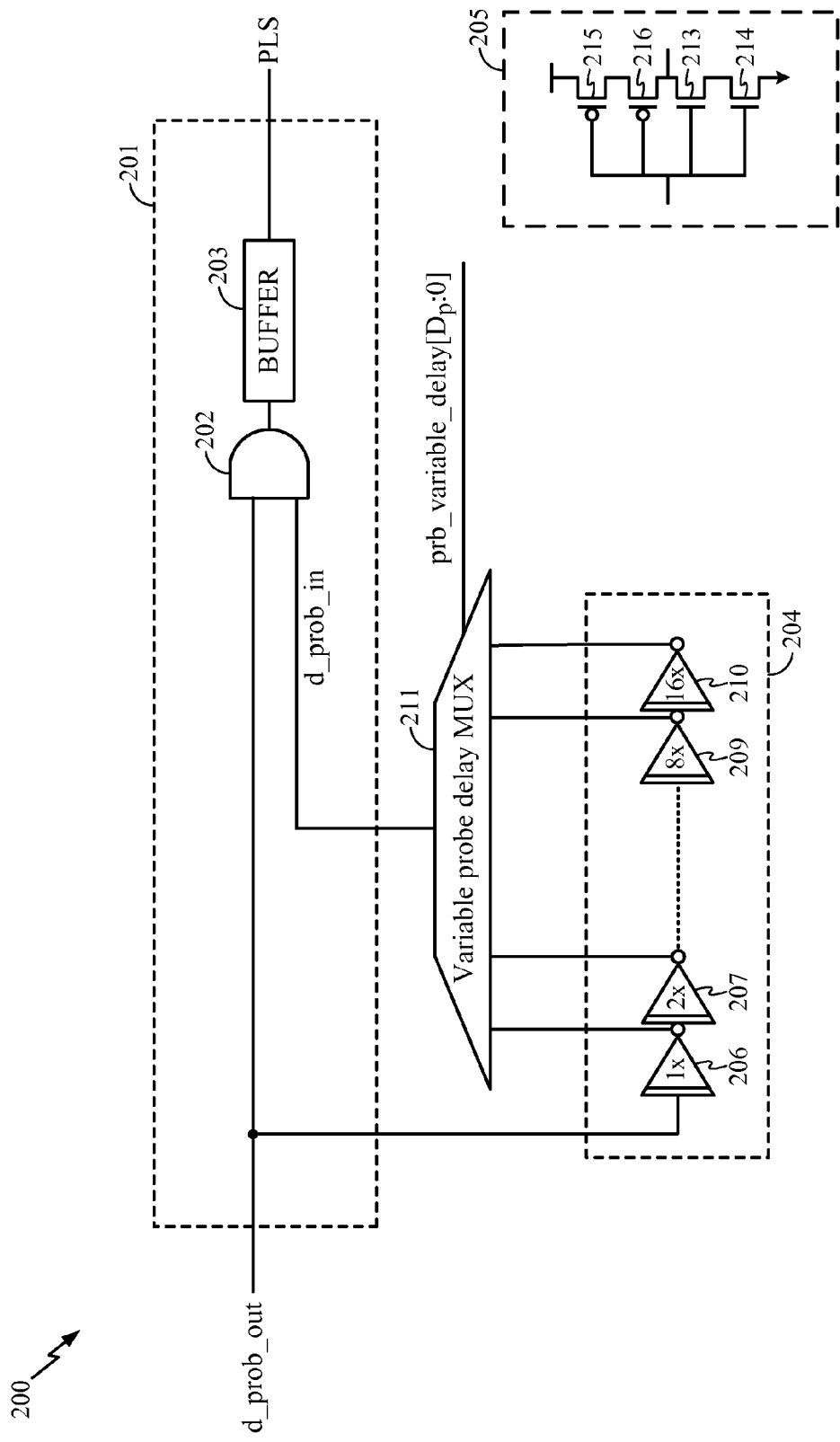
FIG. 2 is a schematic illustrating an exemplary implementation of a variable delay generator and a pulse generator according to one embodiment.

FIG. 2 is a schematic illustrating an exemplary implementation of a variable delay generator and a pulse generator according to one embodiment. A circuit 200 includes a variable delay generator 204 and a pulse generator 201. The variable delay generator 204 in one embodiment may be a number of inverters 206, 207, 209, 210 coupled in a series fashion. Input to the inverter 206 is the offset clock signal, d_prob_out. Although only four inverters are shown, the variable delay generator 204 may include more or less inverters. The delayed clock signal, d_prob_in, is extracted from the variable delay generator 204 through a multiplexer 211. The multiplexer 211 is coupled to the output of each of the inverters 206, 207, 209, 210 and selects one for output onto the delayed clock signal, d_prob_in. The multiplexer 211 selects the amount of delay based on an input delay signal having $D_P$ bits, prb_variable_delay[$D_P$:0]. For example if the multiplexer selects output from the inverter 206, the delayed clock signal, d_prob_in, is delayed by one clock cycle from the offset clock signal, d_prob_out. Alternatively, if the multiplexer selects output from the inverter 207, the delayed clock signal, d_prob_in, is delayed by two clock cycles from the offset clock signal, d_prob_out. The inverters 206, 207, 209, 210 may be implemented according to one embodiment as a stacked inverter 205. The stacked inverter 205 includes two pMOS transistors 215, 216 and two nMOS transistors 213, 214.

The pulse generator 201 in one embodiment may include a AND gate 202 in series with a buffer 203. The AND gate 202 is coupled to the offset clock signal, d_prob_out, and the delayed clock signal, d_prob_in. For example, the AND gate 202 produces a "1" output when both the offset clock signal, d_prob_out, and the delayed clock signal, d_prob_in, are "1". The output from the pulse generator 201 is the pulse signal, PLS.

In the exemplary implementation of FIG. 2, the offset clock signal, d_prob_out, is inverted by the variable delay generator 204 and fed to the pulse generator 201 as the delayed clock signal, d_prob_in. The pulse generator 201 outputs a pulse signal, PLS, whose width is equivalent to the delay of the variable delay generator 204. Because the variable delay generator 204 experiences power supply noise (e.g., voltage droop) when positioned inside a noisy power area such as noisy power area 11, If the variable delay generator 204 includes many inverters to generate a long delay, fast variations in the noisy power are filtered out because they are on the same order of length as the delay generated by the variable delay generator 204. If measurement of short and fast fluctuations in the noise power is desired, the variable delay generator 204 may contain fewer number of inverters to generate a short delay. The length of the delay in the variable delay generator 204 may be chosen by the multiplexer 211. Thus, the circuit 200 may include capability to measure both short and long fluctuations in the noisy power.

Figure 3A:
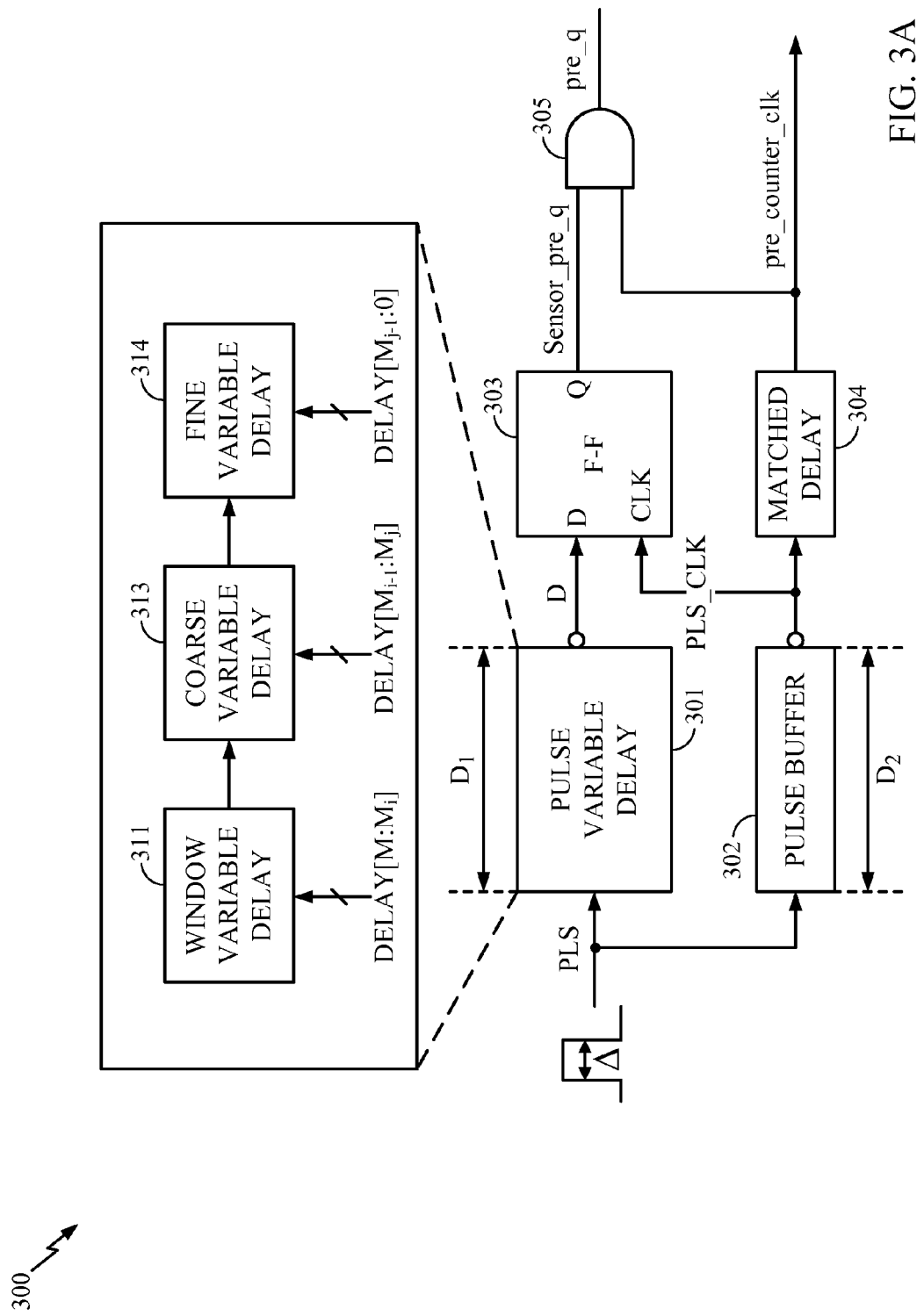
FIG. 3A is a schematic illustrating an exemplary implementation of a sensor according to one embodiment.

FIG. 3A is a schematic illustrating an exemplary implementation of a sensor according to one embodiment. In this example, a pulse variable delay 301 is employed by a sensor 300 for use in determining a width of the pulse signal, PLS. In this exemplary embodiment, the pulse variable delay 301 includes three variable delay blocks, which are window selection 311, coarse variable delay 313, and fine variable delay 314. Each part of the delay is determined by control signals. The control signals may be provided by the control registers 102 of FIG. 1. According to one embodiment, the control register bits are divided into three values. The control register bits delay[M:$M_i$] determines the window selection 311. The control register bits delay[$M_{i-1}$:$M_j$] determines the coarse variable delay 313. The control register bits delay[$M_{j-1}$:0] determines the fine variable delay 314. For example, if the control register bits delay[M:0], are eight bits long (M=8), the first three bits of the control register bits delay [7:5] may be used by the window selection 311. The fourth and fifth bits of the control register bits delay [4:3] may be used by the coarse variable delay 313. Further, the last three bits of the control register bits delay[2:0] may be used by the fine variable delay 314.

The pulse signal, PLS, is received by the pulse variable delay 301 and a pulse buffer 302. The output of the pulse variable delay 301 is a data signal, D, which is the pulse signal, PLS, delayed by an amount $D_1$. The pulse buffer 302, which also accepts as input the pulse signal, PLS, outputs a pulse clock signal, PLS_CLK. The pulse clock signal, PLS_CLK, is the PLS signal, PLS, delayed by an amount $D_2$. The data signal, D, and the pulse clock signal, PLS_CLK, are input to a D flip-flop 303. The pulse variable delay 301 may be implemented as described below, and the pulse buffer 302 may be implemented, according to one embodiment, as inverters connected in series.

The D flip-flop 303 functions to compare the data signal, D, and the pulse clock signal, PLS_CLK. The D flip-flop 303 outputs a comparison signal, sensor_pre_q, that is the last value input on the data line, D, at the time the pulse clock signal, PLS_CLK, experiences a rising edge. For example, when the difference between D1 and D2 is shorter than the pulse width, Δ, a low value is present on the data line, D, when the pulse clock, PLS_CLK, goes high. Thus, comparison signal, sensor_pre_q, is low. Alternately, when the difference between D1 and D2 is greater than the pulse width, Δ, a high value is present on the data line, D, when the pulse clock, PLS_CLK, goes high. Thus, the comparison signal, sensor_pre_q, is high.

According to one embodiment, the pulse width, Δ, of the pulse signal, PLS, may be determined by cycling through different D1 values of the pulse variable delay 301 and determining at which delay value the comparison signal, sensor_pre_q, goes high. The pulse width, Δ, is correlated to a corresponding delay[$M_i$:0] signal. Thus, the comparison signal, sensor_pre_q, should be returned to low after each cycle of the pulse clock buffer, PLS_CLK. A matched delay 304 accepts as input the pulse clock buffer, PLS_CLK, and outputs an asynchronous clock, pre_counter_clk. The asynchronous clock, pre_counter_clk, is a stretched representation of the pulse clock buffer, PLS_CLK, such that the width of the pulse is larger. The asynchronous clock, pre_counter_clk, and the comparison signal, sensor_pre_q, are input to an AND gate 305. The output of the AND gate 305, pre_q, is high only when the comparison signal, sensor_pre_q, and the asynchronous clock, pre_counter_clk, are high. The asynchronous clock, pre_counter_clk, is stretched such that it is high during any possible arrival times of a high signal on the comparison signal, sensor_pre_q, but returns to low between cycles of the pulsed clock buffer, PLS_CLK. According to one embodiment, the stretching of cycles in the asynchronous clock, pre_counter_clk, is accomplished by skewing the pulse clock buffer, PLS_CLK. In such an embodiment the falling delay of the matched delay 304 should be smaller than the pulse width, Δ, of the pulse signal, PLS. Additionally, the rising delay should be larger than the worst delay of the D flip-flop 303 for latching output onto the comparison signal, sensor_pre_q, from the data signal, D, at a rising edge of the pulse clock buffer, PLS_CLK.

Figure 3B:
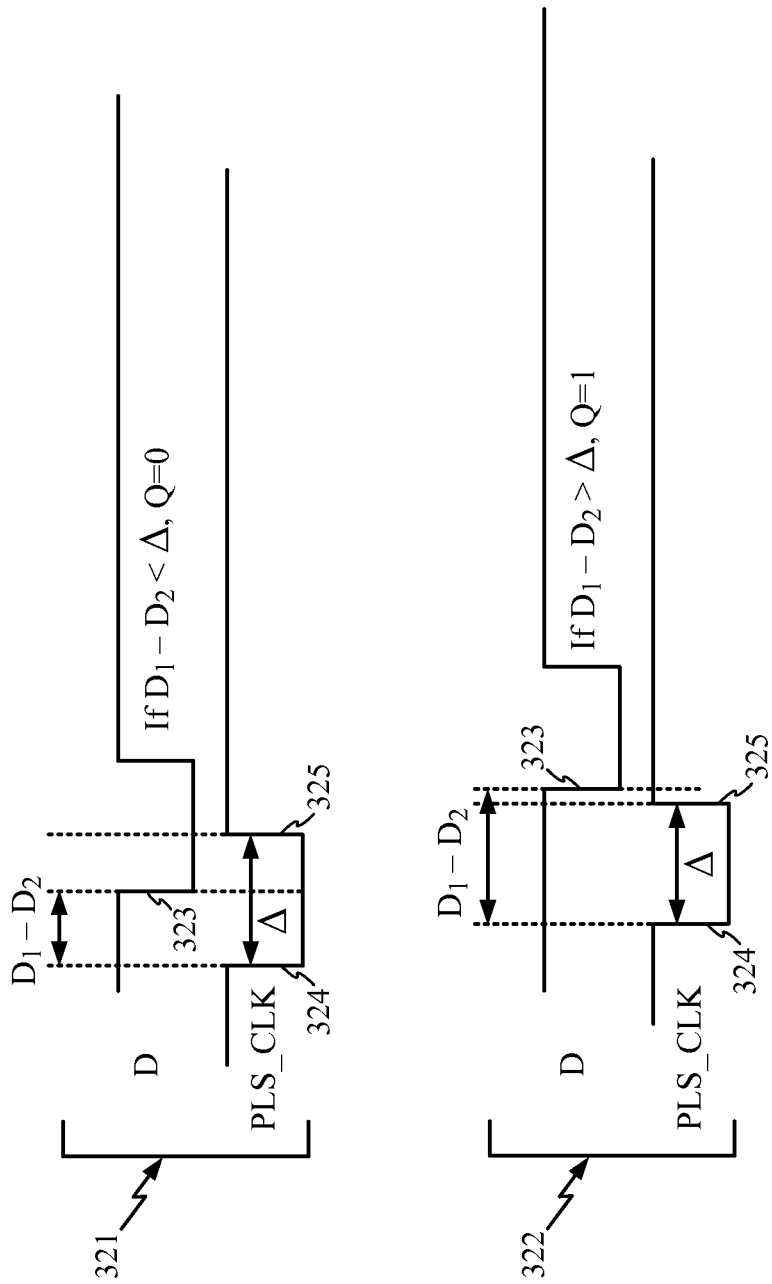
FIG. 3B is a timing diagram illustrating waveforms for the data signal, D, and the pulse clock buffer signal, PLS_CLK, for two different scenarios.

FIG. 3B is a timing diagram illustrating waveforms for the data signal, D, and the pulse clock buffer signal, PLS_CLK, for two different scenarios. In a first scenario 321, the falling edge 323 of the data signal, D, arrives before a rising edge 325 of the pulse clock buffer, PLS_CLK. A difference ($D_1$–$D_2$) between a falling edge 323 of the data signal, D, and a falling edge 324 of the pulse clock buffer, PLS_CLK, is thus less than the width, Δ, of the pulse clock buffer signal, PLS_CLK. Accordingly, in the first scenario 321, the comparison signal, sensor_pre_q, is low. In a second scenario 322, the falling edge 323 of the data signal, D, arrives after the rising edge 325 of the pulse clock buffer, PLS_CLK. A difference ($D_1$–$D_2$) between the falling edge 323 of the data signal, D, and the falling edge 324 of the pulse clock buffer, PLS_CLK, is thus greater than the width of the pulse clock buffer, PLS_CLK. Accordingly, in the second scenario 322, the output of comparison signal, sensor_pre_q, is high.

Figure 3C:
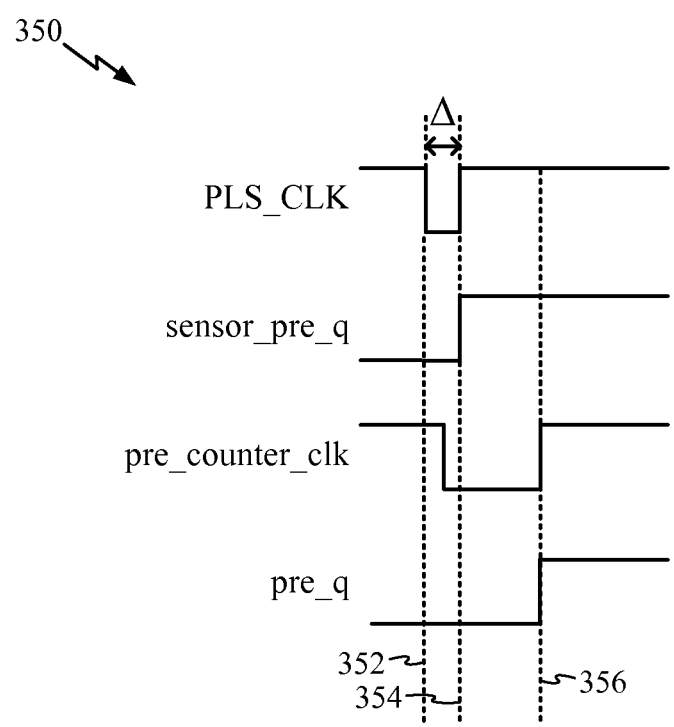
FIG. 3C is a timing diagram illustrating signals in the circuit of FIG. 3A according to one embodiment.

FIG. 3C is a timing diagram illustrating signals in the circuit of FIG. 3A according to one embodiment. A timing diagram 350 includes the buffered pulse signal, PLS_CLK, the flip flop output, sensor_pre_q, the sensor clock signal, pre_counter_clk, and the sensor output, pre_q. At a time 352 the buffered pulse signal, PLS_CLK, goes low. Shortly afterwards, the counter clock signal, pre_counter_clk, goes low. After a time period, Δ, at time 354 the buffered pulse signal, PLS_CLK, returns to high. At a rising edge of the buffered pulse signal, PLS_CLK, the output, pre_q, latches onto a new value provided at the D flip-flop 303. The output signal, pre_q, is the result of the AND gate 305 performed on the output signal, sensor_pre_q, and the counter clock signal, pre_counter_clk. At a time 356 the counter clock signal, pre_counter_clk, goes high. As a result, the output signal, pre_q, goes high because both inputs to the AND gate 305 are high.

FIGS. 4A-4C are schematics illustrating exemplary embodiments of the fine variable delay, the coarse variable delay, and the window selection, respectively. FIG. 4A is a schematic illustrating an exemplary embodiment of a fine variable delay. A circuit 400 includes a decoder 402, which receives delay bits, DELAY[$M_{j-1}$:0], and outputs $M_{j-1}$ number of signals that selectively turn on and off FETs 410. The FETs 410 are used to select the number of inverters 404 that are selected. The more inverters 404 added to the path of the pulse signal the longer the delay generated. The inverters 404 are coupled in series, in one embodiment, and in even numbers such that an output signal is not inverted. Although only three sets of the inverters 404 and the FETs 410 are illustrated, the circuit 400 may include many more depending on the desired adjustable delays. According to one embodiment, the delays achievable by the circuit 400 are 1-10 picoseconds.

FIG. 4B is a schematic illustrating an exemplary embodiment of a coarse variable delay. A circuit 420 includes a multiplexer 429, which receives delay bits, DELAY[$M_{i-1}$:$M_j$] to control delay through inverters 422. According to one embodiment the delays achievable by the circuit 420 are 10-30 picoseconds. The combination of the circuit 400 and the circuit 420 produces a linearly increasable delay, according to one embodiment.

FIG. 4C is a schematic illustrating an exemplary embodiment of a window delay. The circuit 430 includes a multiplexer 435, which receives delay bits, DELAY[M:$M_1$] to control delay through window delays 432. The multiplexer 435 selects how many of the window delays 432 will control the amount of delay. Design of the size of window delays 432, according to one embodiment, may include overlap to ensure that no delay range is unavailable.

As discussed above, the delay[$M_j$:0] signal that generates a high at the output signal, pre_q, can be mapped using a table to determine the width, Δ, of the pulse signal, PLS. Thus, the width, Δ, includes the desired voltage droop information. Determining the width, Δ, with absolute certainty in an on-chip environment is challenging due to various noise factors, including jitter. As a result, the measured widths, Δ, have an associated error. According to one embodiment, a cumulative distribution function may instead be measured by determining the probability of a certain width, Δ, for a given delay[$M_j$:0] signal. Counters are employed to enable the collection of cumulative distribution functions as described below.

Figure 5:
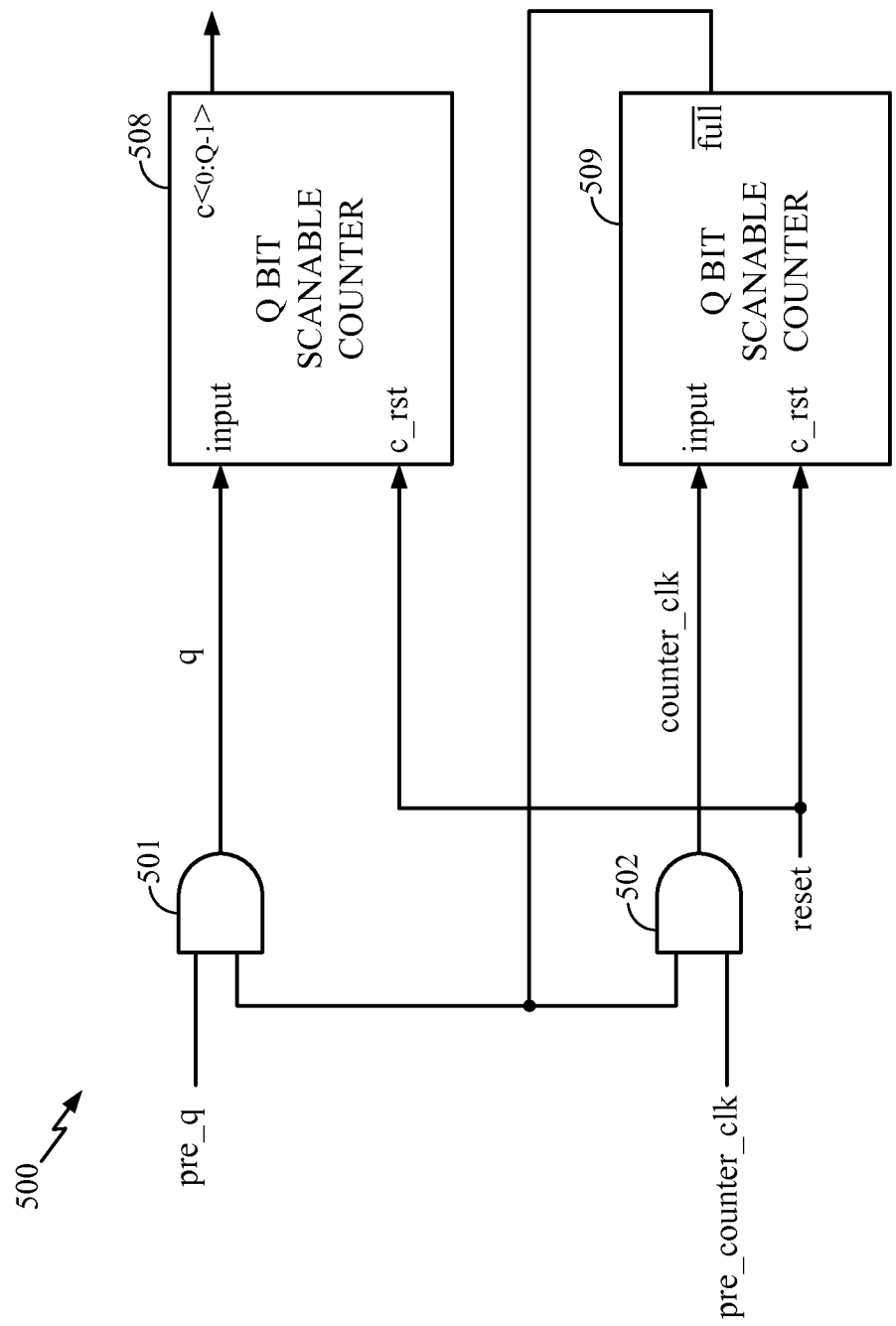
FIG. 5 is a block diagram illustrating one embodiment of an arrangement of counters for counting sensor outputs.

FIG. 5 is a block diagram illustrating one embodiment of an arrangement of counters for counting sensor outputs. A circuit 500 includes q-bit scannable counters 508, 509. The counter 508 accepts an input signal, q, and a reset signal, reset. The counter 508 outputs a counter signal, c<0:Q-1>. The counter signal, c<0:Q-1>, is a value representing the number of ones that have been provided to the input signal, q, since the last reset signal, reset. The counter 509 accepts as input a clock signal, counter_clk, and the reset signal, reset. The counter 509 outputs a not full signal, /full. The not full signal, /FULL, is high when the number of clock cycles that have passed since the last reset signal, reset, is below a defined number. When a defined number of clock cycles is reached, the not full signal, /FULL, goes low.

The not full signal, /full, is coupled to AND gates 501, 502. The AND gate 501 is coupled to the output, pre_q, and the not full signal, /full. The output of the AND gate 501 is the output, pre_q, anytime the not full signal, /full, is high. Thus, when the counter 508 is filled with data, the not full signal, /full, prevents additional data from the output, pre_q, from arriving at the counter 508. Likewise, the AND gate 502 is coupled to the clock signal, pre_counter_clk, and the not full signal, /full. The output of the AND gate 502 is the clock signal, pre_counter_clk, anytime the not full signal, /full, is high. Thus, when the counter 509 is full of data, the AND gate 502 prevents additional data from reaching the counter 509.

For example, after the reset signal, reset, is activated, the counter 508 begins at zero and counts the number of times a high value on input signal, q, is obtained. Simultaneously, the counter 509 begins at zero and counts the number of clock cycles on the clock signal, counter_clk. After a specified number of cycles is reached, which may be 63 according to one embodiment, the not full signal, /full, goes low and prevents additional data from reaching the counters 508, 509. The counted number of times a high value on input signal, q, is recorded may be read from the counter signal, c<0:Q-1>. A probability may be calculated by dividing the count read at the counter output, c<0:Q-1>, by the number of clock cycles. According to one embodiment, the clock signal, pre_counter_clk, is asynchronous to the clock signal, CLK. Thus, the circuit 500 may include pipe-lined delay at internal nodes to increase performance.

Figure 6A:
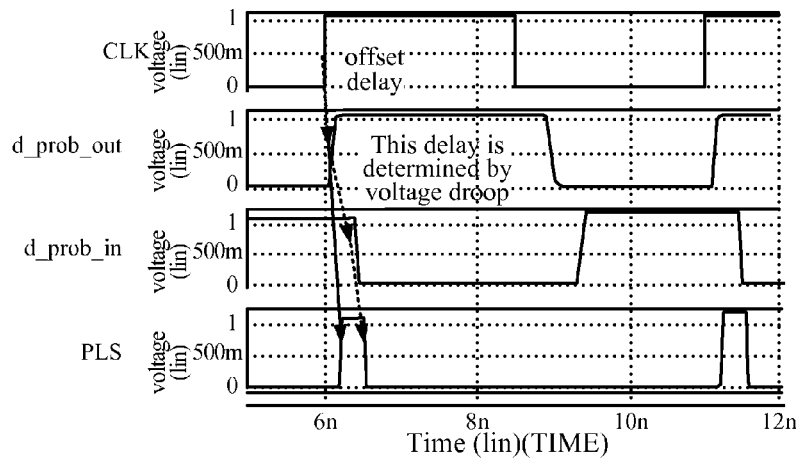
FIGS. 6A-6C are timing diagrams illustrating exemplary interaction waveforms for various signals, according to one embodiment of the on-chip voltage sensor.
Figure 6B:
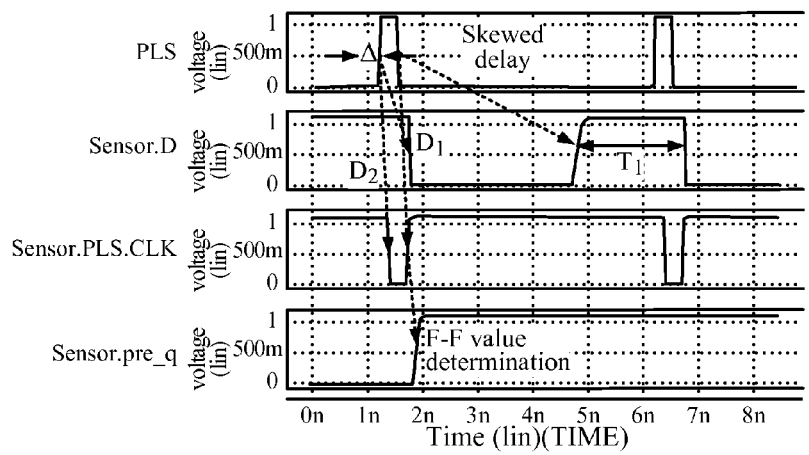
Figure 6C:
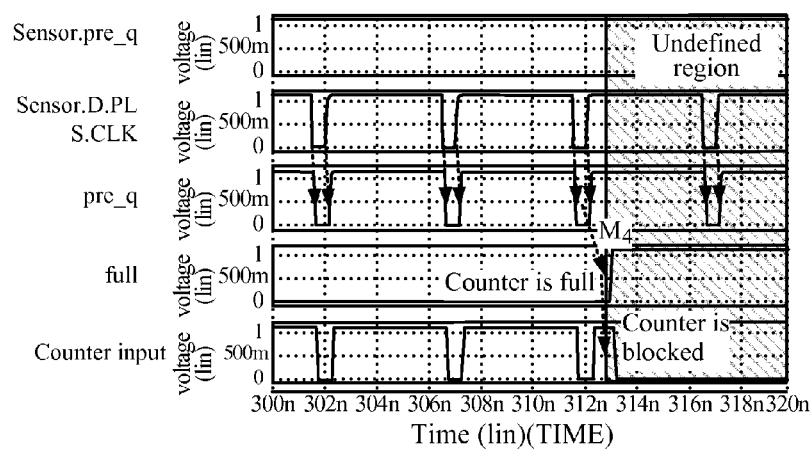

FIGS. 6A-6C are timing diagrams illustrating exemplary interaction waveforms for various signals for one embodiment of the on-chip voltage sensor. Offset delay determines the phase alignment between the rising edges of clock CLK and d_prob_out (of FIG. 1). As shown in FIG. 1, the d_prob_out node is utilized as the input of the probing variable delay generator 106. Hence, in this exemplary embodiment, the delay of d_prob_out to d_prob_in is determined by voltage droop of the standard cell block (e.g., the noisy power area 11 of FIG. 1). The output PLS of the pulse generator 104 has the same width as the delay of d_prob_out to d_prob_in. By employing the variable delay of the "pulse variable delay" 301 (of FIG. 3A), the pulse width, A, is converted to a digital control signal.

As discussed above, skewed delay elements are used in certain embodiments for the pulse variable delay 301. FIG. 6B shows that the rising delay of PLS to D is significantly larger than the falling delay. For correct function, the node D needs to fall before the next rising. In other words, $T_1$ in FIG. 6B should be positive at the worst case. In a normal situation, $T_1$ would be the same as half clock cycle. However, the skew of the pulse variable delay 301 results in reduction of $T_1$ in this exemplary embodiment. In other words, the skew of the pulse variable delay 301 of FIG. 3A can degrade the performance of the proposed voltage sensor. For instance, in certain implementations, the maximum operating frequency is 200 MHz.

FIG. 6C illustrates the operating principle of the counters 508, 509 (of FIG. 5) according to one embodiment of the present disclosure. Because the output signal, pre_q, is AND gated with the delayed signal D_PLS_CLK, the output (pre_q) has "return to zero" for every clock cycle. By counting the rising edges of pre_q, a statistical value is obtained. The counter 509 raises its "full" signal whenever it accepts a preset number (e.g., 63) clock rising edges. At this moment, both counter inputs are shadowed to "low" and hence, any transition of the signals pre_q and D_PLS_CLK does not affect the counter outputs. This time region is named as "undefined region" in FIG. 6C. A reading process is employed to read the counter output during the "undefined region" of FIG. 6C.

As discussed above, in certain embodiments the pulse width PLS is converted to a control signal delay[M:0] to obtain relative voltage droop. However, absolute voltage droop is still unknown. In certain embodiments, a table technique addresses this issue. Before measurement, in one embodiment, a table is made which maps the delay[M:0] signal to effective voltage droop. Since the power of the sensor is disconnected from the power of the probing part, the power of the probing part can be swept and the sensor power fixed to normal $V_{DD}$ (e.g., 1.125V). The swept power of the probing part affects the generated pulse width (Δ), and the Δ can be converted to the delay[M:0] signal employing the above-described techniques.

An exemplary technique for setting up this table according to one embodiment is now discussed. In order to exclude impact of temperature variation, the exemplary table techniques provided herein are used in certain embodiments. It should be noted that process variation is shared commonly during measurement. Hence, the impact of process variation is removed. However, temperature variation may still exist, which may lead to inaccurate results. Because one table is created for every An exemplary process that may be employed is as follows:

---

For T = −30° C. to 130° C. (by 10° C.)
    For vdd_prb = 1.125V to 0.845V (−10mV)
        For delay[M:0] 0 to 255
            enable (c_rst) and disable clk (2.5 cycle);
            while (full=0) Measurement;
            scan-out c_sout during 6 cycle;
        End delay
    End vdd_prob
End T

---

The above exemplary process can be summarized as three dimensional for-loops. To cope with temperature variation, one table is created for one temperature grid (from −30° C. to 130° C. in this example).

Figure 8:
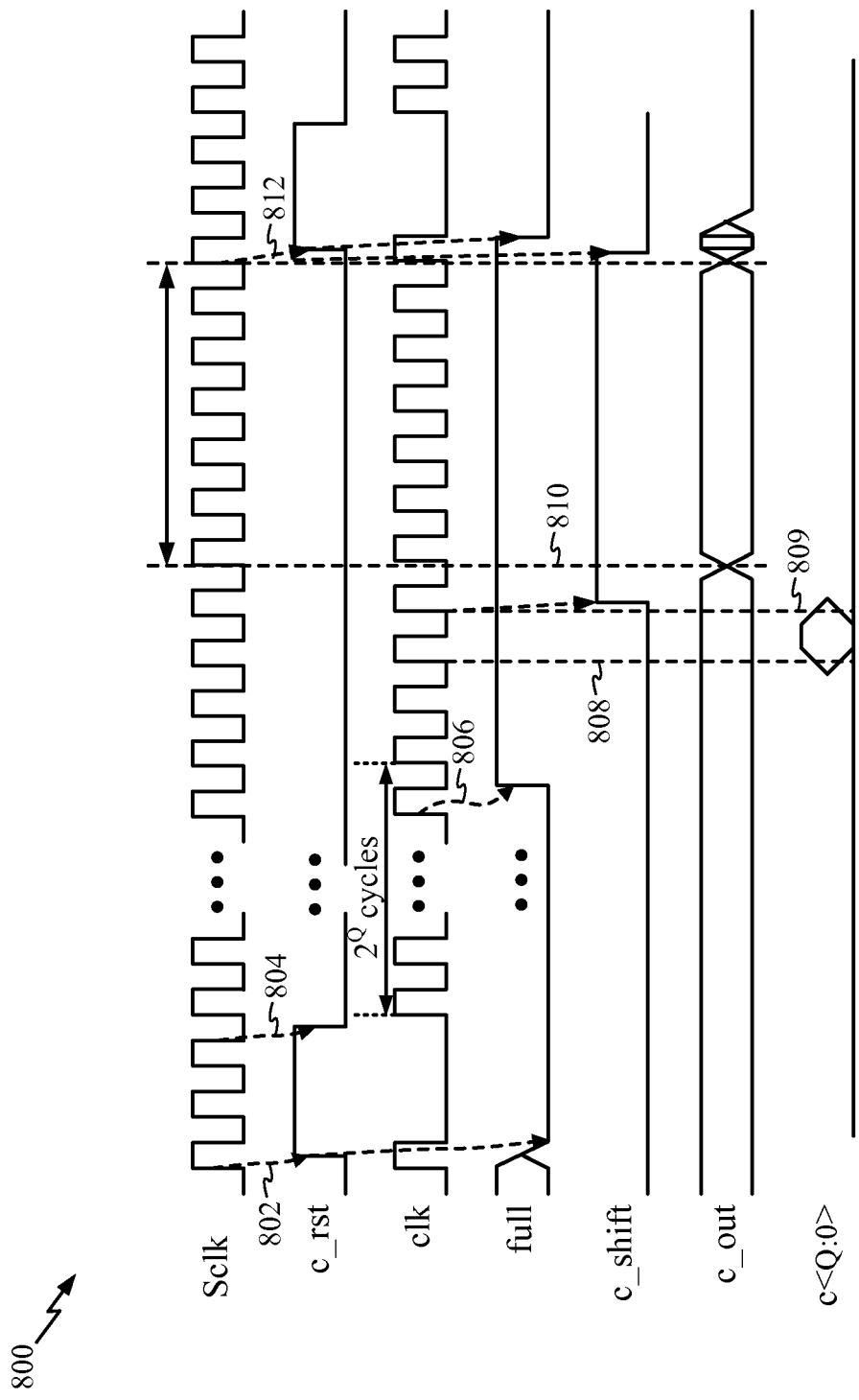
FIG. 8 is a timing diagram illustrating an example of a table set up process according to one embodiment.

FIG. 8 is a timing diagram illustrating an example of a calibration process according to one embodiment. In a timing diagram 800 at a time 802, a reset signal, c_rst, goes high. During reset, an external clock, Sclk, is not replicated on an internal clock, clk. Also during reset, a full signal, full, goes low. At a time 804, the reset signal, reset, goes low indicating the start of a new counting cycle. The external clock signal, Sclk, is then replicated on the internal clock signal, clk, and counting beings until a fixed number of clock cycles completes indicated by the full signal, full, at a time 806.

Either parallel or serial read out may occur. In the case of parallel read out, at a time 808, parallel readout is accomplished by reading the value from parallel output lines, c<Q: 0>. In the case of serial read out (for example due to a pin limitation), at a time 809 a shift enable signal, c_shift, goes high indicating the start of the series read-out. At a time 810, serial readout is accomplished by reading the value from a serial output line, c_out, in synchronization with the internal clock signal, clk. At a time 812, the shift enable signal, c_shift, goes low indicating read-out of the counter value is complete and the reset signal, c_rst, goes high indicating the start of a new counting cycle for the next delay value. When the full signal goes high, the threshold delay value at that time is marked. The process repeats for all delay, voltage, and temperature values to create per temperature calibration tables with marked delay, an example of which is shown in FIG. 7A.

Figure 9:
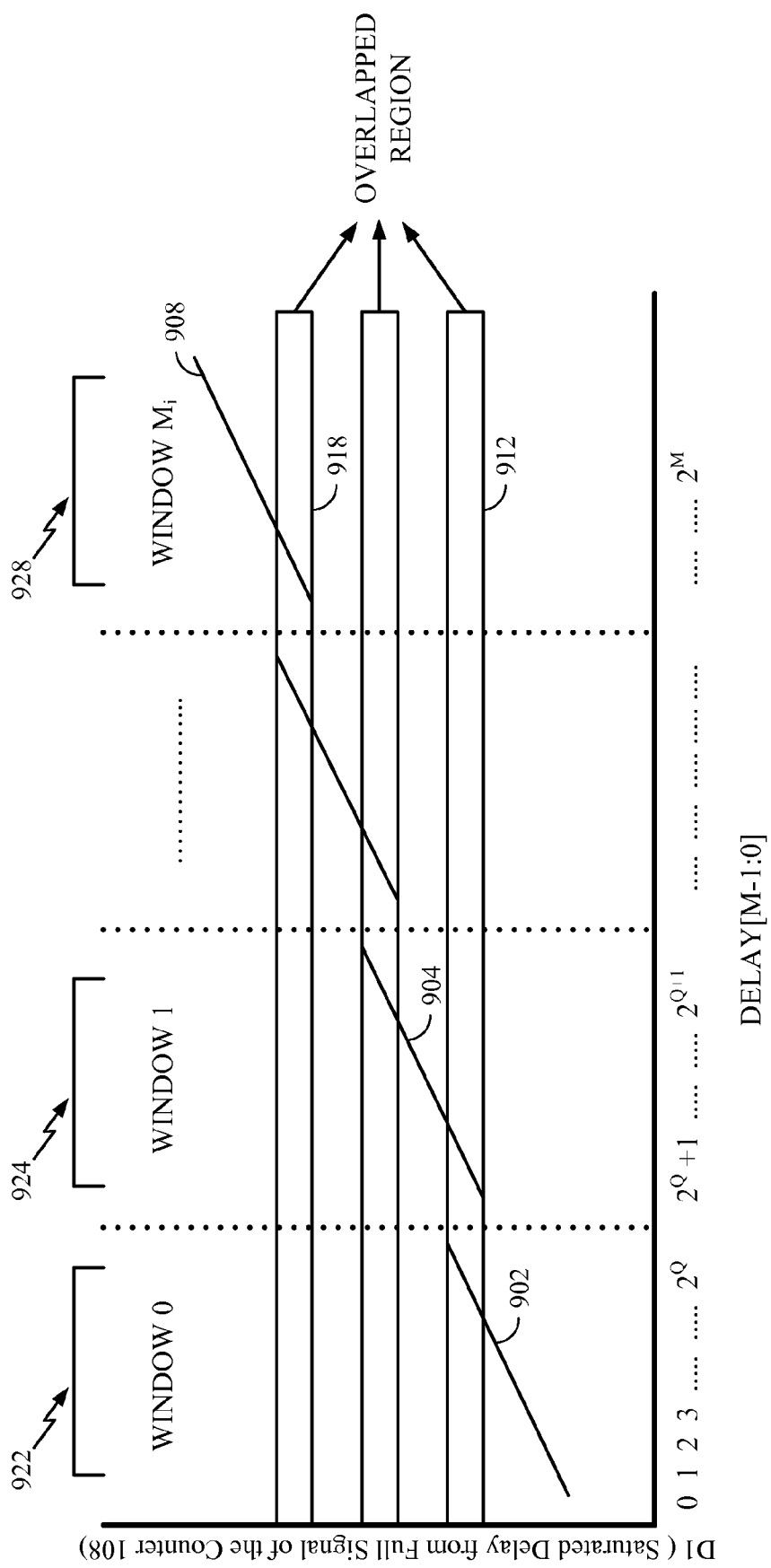
FIG. 9 is a table that shows data in overlapping regions in more detail.

The table of FIG. 7A includes data in overlapping regions that should be removed. FIG. 9 is a table that shows data in overlapping regions in more detail. These overlapping regions prevent making a one-to-one mapping between voltage droop and the delay signal because of broken proportionality. To make one-to-one mapping between voltage droop and the delay[M:0] signal, the delay of the pulse variable delay 301 (of FIG. 3A) needs to be proportional to the delay [M:0] signal in this exemplary embodiment. However, this proportionality is broken due to overlapped regions between adjacent windows (as illustrated in FIG. 9) employed in this exemplary embodiment. For example, a saturated delay line 902 for a window 922 is illustrated with a maximum value larger than a minimum of a saturated delay line 904 of a neighboring window 924. This results in an overlapping region 912 between the window 922 and the window 924. A series continues M times through a window 928 having a saturated delay line 908 and a final overlapping region 918. Hence, several calibration processes are proposed below to remove the issue caused by such overlapped regions. The window overlap happens at the border of window delay (delay[M:0]) and can be removed, as described with respect to FIG. 7A.

FIG. 7A is a table of outputs, obtained from a data collector during calibration, having broken proportionality. For each temperature value, the calibration process is performed and an initial measurement table may be constructed.

In a table 700, overlap removal is needed for the voltage 0.995. At the border of the window delay there may be an overlap region due to mismatch of the coarse and fine delay tuning against each unit of the delay window. For each voltage level, at the border of the window delay, values are removed from the table 700 which do not follow a monotonically increasing relation of the delay versus counter output for the lower delay value. After this process the final table has a monotonic increase in the delay and output.

For each row, the value(m+1) should be greater than or equal to the value(m). If value(m) is greater than value(m+1), then the entire row of value(m) is removed from the table. For example, in the table 700 the rows 61, 62, and 63 contain values higher than row 64. In this case, rows 61, 62, and 63 are removed from the table. That is, after processing the value of the counts increase or stay the same as delay increases (going down the column). Also the voltage value is decreasing or the same (going across the row) in one embodiment.

FIG. 7B shows a final measurement table, according to one embodiment. From the measurement setup table 700, a final measurement table 720 may be populated having assigned to each voltage level a border threshold delay value. Each column of the measurement setup table 700 after overlap removal is scanned down until a threshold value is exceeded. The delay[M:0] value that exceeds the selected threshold is placed in the final measurement table 720. For example, value n is the delay[M:0] value that exceeded the threshold for $V_{DD}$ of 1.125, and value m is the delay[M:0] value that exceeded the threshold value for $V_{DD}$ of 1.115. The threshold value may be, for example, Q/2.

Figure 10A:
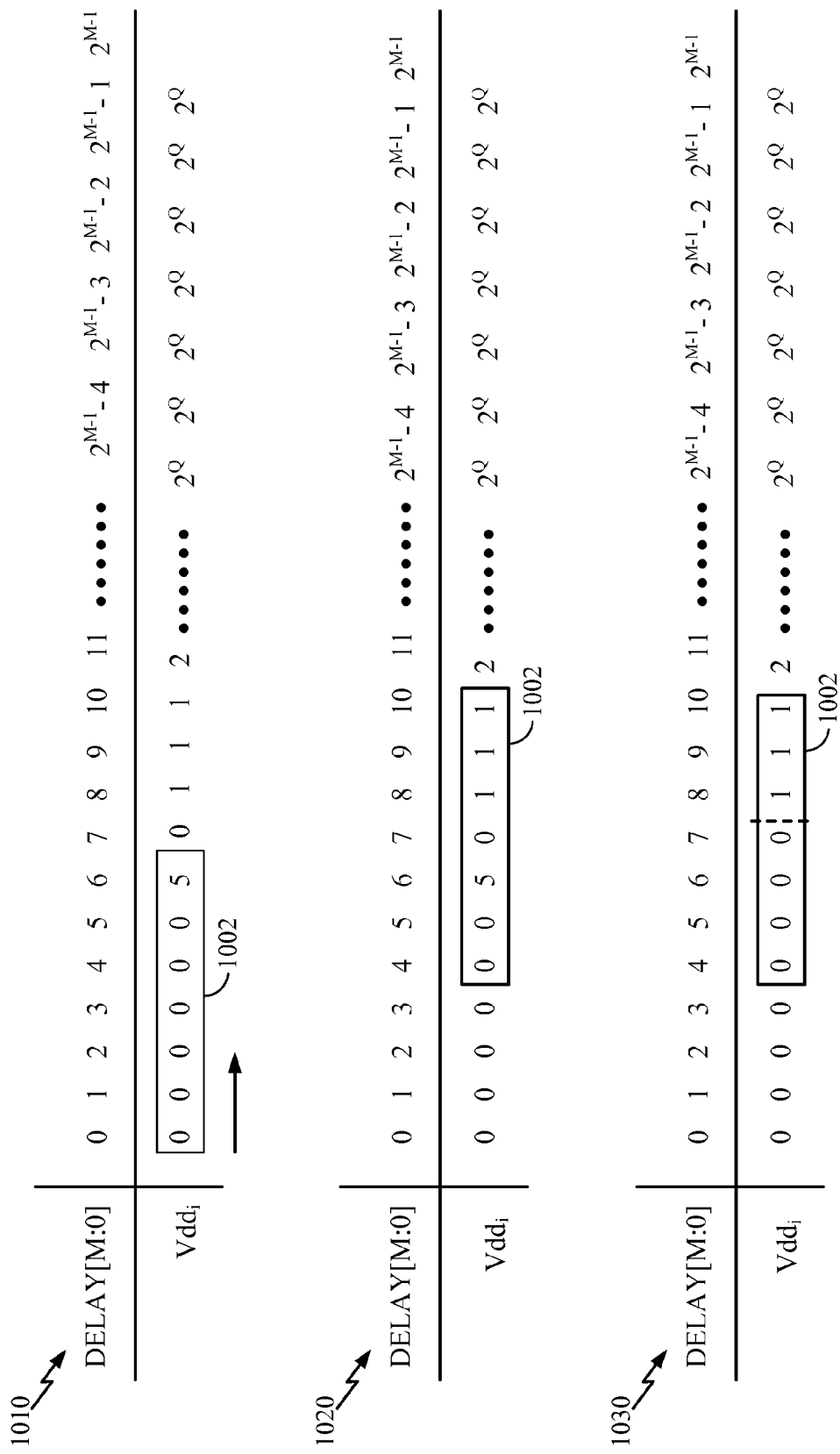
FIG. 10A is a chart illustrating one exemplary implementation of a voting process.
Figure 10B:
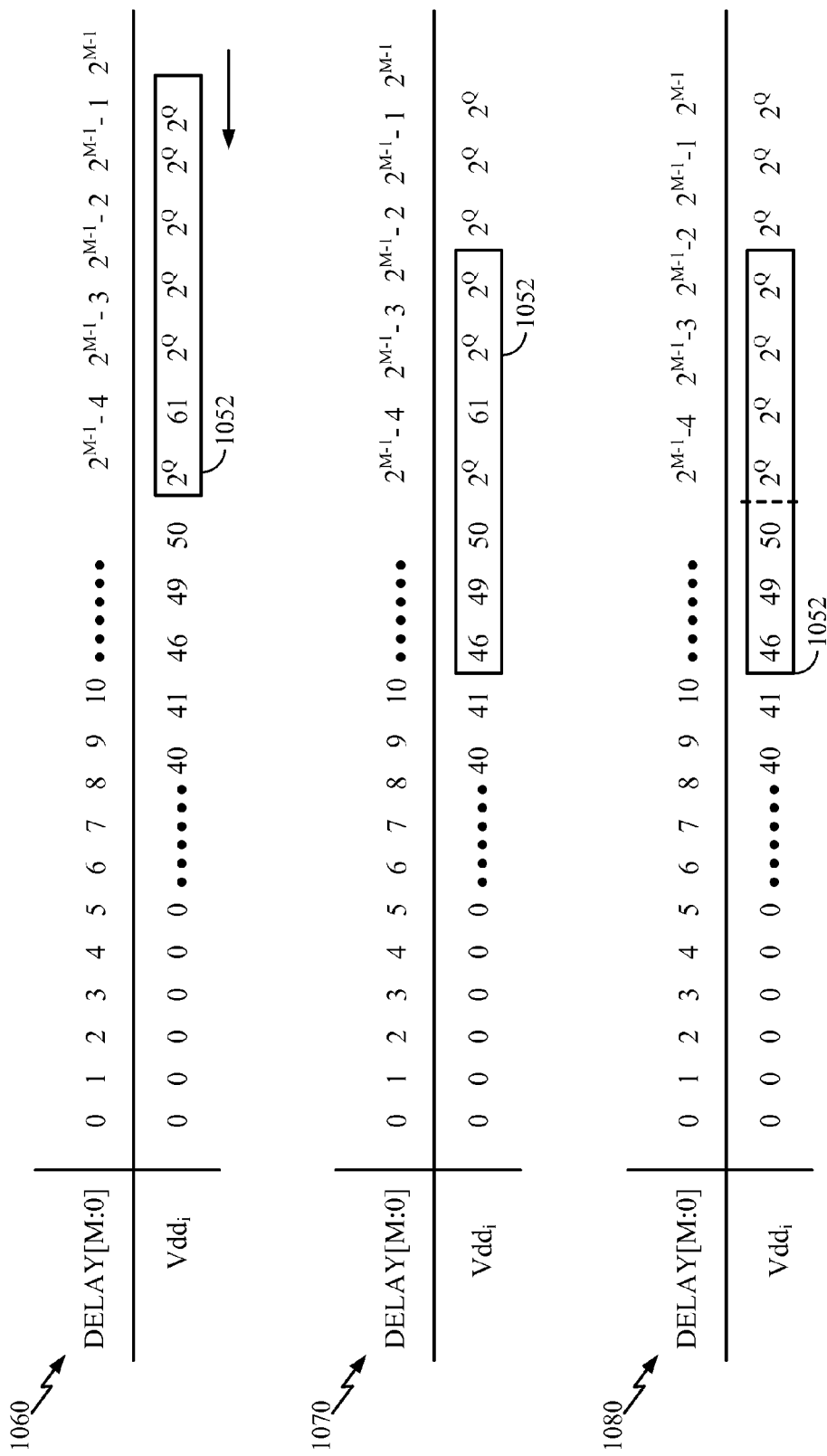
FIG. 10B is a chart illustrating another exemplary implementation of a voting process.

After final measurement tables are created, a voting process is employed to remove small glitches. One exemplary implementation of this voting process is illustrated in FIGS. 10A-10B. The voting process assigns specific DELAY[M:0] signals to quantized voltage levels (e.g., a level of voltage droop). Thus, this exemplary implementation is used during calibration of the voltage sensor. In a chart 1010, a window 1002 starts from the left side. The window 1002 continues to slide right until the majority element is not "0" as in a chart 1020. The window 1002 is stopped and whole numbers before the final "0" inside the window 1002 are set to "0," as seen in a chart 1030. All the glitches before the last "0" are converted to "0". In a similar way, glitches may be removed from the maximum values as shown in FIG. 10B.

FIG. 10B is a chart illustrating another exemplary implementation of a voting process. In FIG. 10B, the process of the backward masking to $2^Q$ is described. A window 1052 of M bits moves backwards from the end of the calibration table in FIG. 10B, as seen in a chart 1060. The window 1052 slides left and stops when the majority of the bits are not $2^Q$ as seen in a chart 1070. Then, all higher counter values in the chart 1060 are masked to the $2^Q$ to remove the glitch and preserve the monotonic increase as in a chart 1080.

After voting processes, measurement table set up is started. It should be noted that no mapping occurs between effective $V_{DD}$ and delay[M:0] in this exemplary embodiment. In current tables, the count output numbers are listed depending on effective $V_{DD}$ and delay[M:0]. The numbers represent the probability that the $V_{DD}$ can be mapped to delay[M:0]. Hence, the delay[M:0] signal at which the probability becomes larger than half is chosen (the number is 32 in this exemplary embodiment). With this policy, one measurement table is obtained for every temperature grid. The obtained measurement table may then be verified by confirming values decrease as the voltages decrease down the table, and confirming the values increase as the delay increases across the table.

The delay of the pulse variable delay 301 increases with delay[M:0] incrementally. Pulse width becomes larger as voltage droop increases. In the table technique, the matched value between the delay and pulse width is sought. This means that the mapped delay[M:0] should be increased with low effective $V_{DD}$. When this requirement is not satisfied, the obtained measurement table can be regarded as wrong data, in which case the total table set up process may be performed again for debugging.

Figure 11:
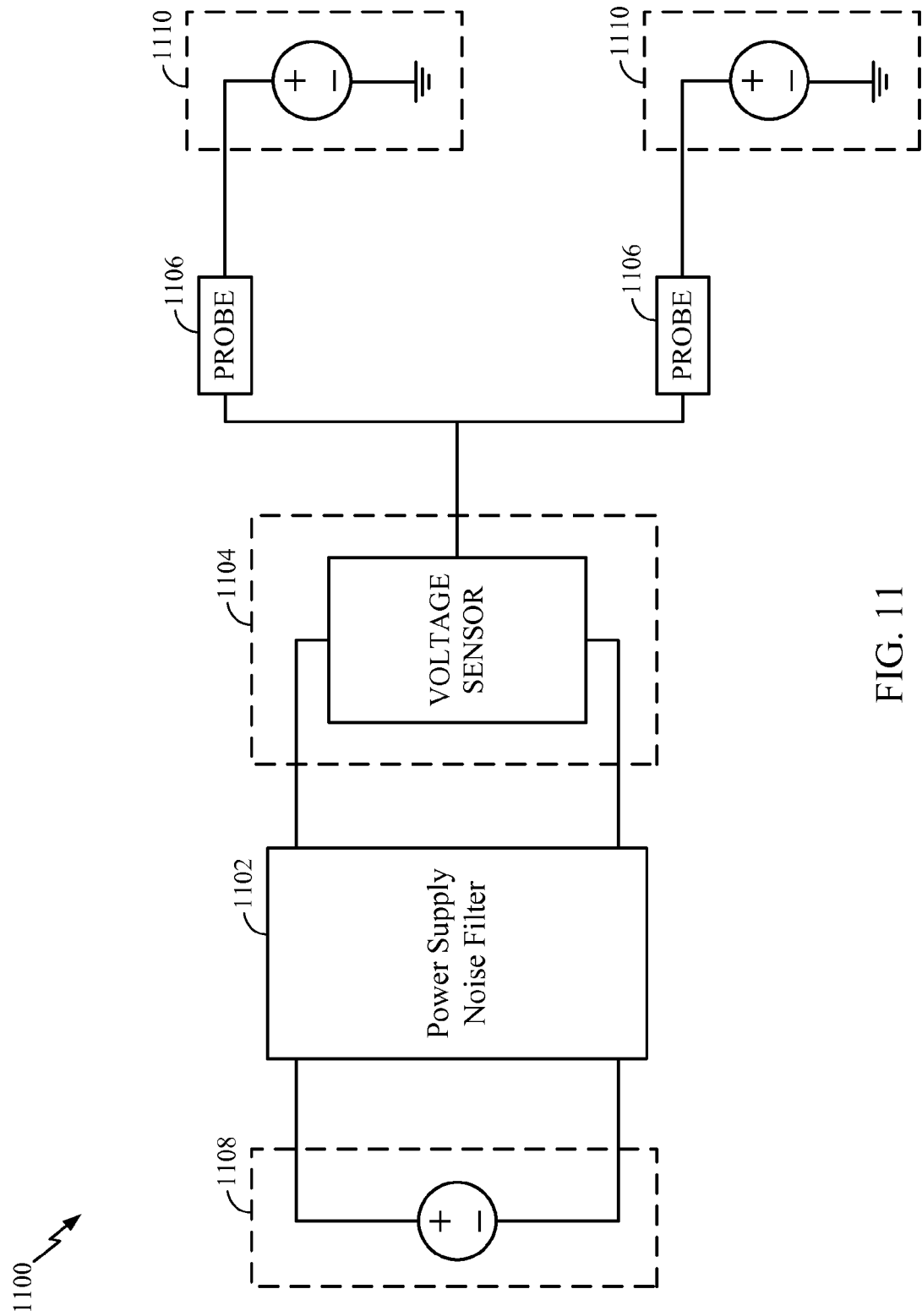
FIG. 11 shows an exemplary schematic of an implementation of the on-chip voltage sensor via system on chip (SOC) integration, according to one embodiment of the present disclosure.

FIG. 11 shows an exemplary schematic of an implementation of the on-chip voltage sensor via system on chip (SOC) integration, according to one embodiment of the present disclosure. The probing scheme could be enhanced as seen in FIG. 11 with multiple distributed probes. On a chip 1100, a voltage sensor 1104 is implemented, and is in communication with one or more probes 1106. The voltage sensor 1104 may be the clean power area 10 (of FIG. 1) combined with one or both of the first data collector 12 and the second data collector 13. The voltage sensor 1104 is powered by a power supply 1108 that is passed through a power supply noise filter 1102 before reaching the voltage sensor 1104. Coupled to the voltage sensor 1104 are probes 1106. The probes 1106 may be the variable delay generator 106 (of FIG. 1). The probes are coupled to power supplies 1110 that are to be measured for dynamic power noise (e.g., voltage droop).

The power supply noise filter 1102 ensures that measurements taken by the voltage sensor 1104 are not influenced by noise in the power supply 1108. If the voltage sensor 1104 is operated with noisy power it would be difficult to remove the noise caused by the power supply 1108 from the noise caused by power supplies 1110.

Figure 12:
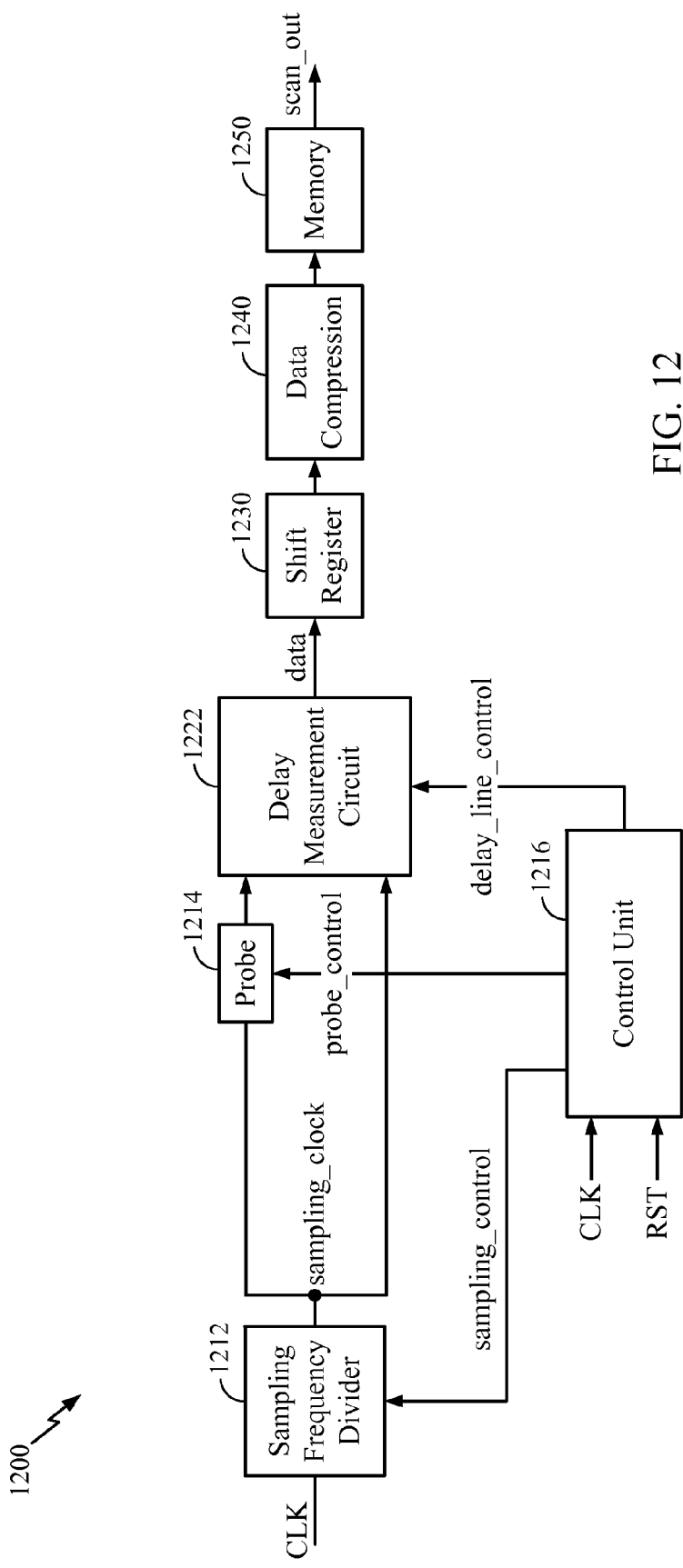
FIG. 12 is a block diagram illustrating an exemplary top level architecture of a non-periodic noise measurement circuit.

FIG. 12 is a block diagram illustrating a top level architecture of a non-periodic noise measurement circuit. A frequency divider 1212 adjusts the resolution of sampling. A probe circuit 1214 is coupled to the frequency divider 1212. A control unit 1216 adjusts a sampling clock signal, sampling_clock, through a control signal, sampling_control, coupled to the frequency divider 1212. The control unit 1216 also controls offset of the probe circuit 1214 through a control signal, probe_control, and the variable delay of a delay measurement circuit 1222 through a control signal, delay_line_control. A measured data signal, data, may be streamed out to a shift register 1230 coupled to a compression unit 1240 coupled to a memory device 1250. The measured data may then be read out through a read-out signal, scan_out. The read-out signal, scan_out, may be a parallel data stream or a serial data stream.

Figure 13:
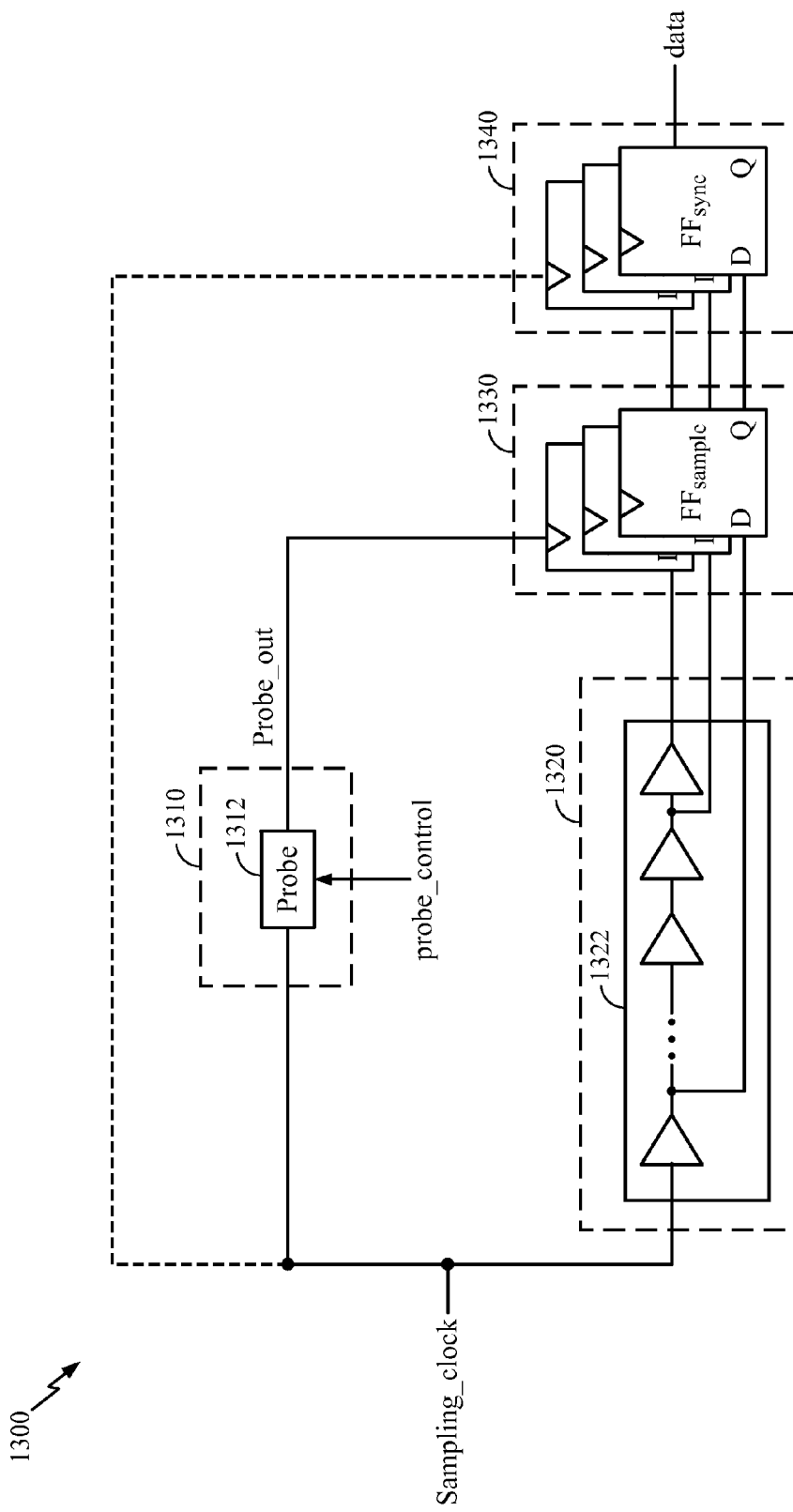
FIG. 13 is a circuit schematic illustrating a parallel measurement option.

FIG. 13 is a circuit schematic illustrating a parallel measurement option. For multiple measurements, multiple instances of the delay[M:0] are generated which enables measurement of more than one sampling point at a given time. The measurement may be clustered in groups according to voltage level. For example, $[v_N, v_{N+1}, v_{N+2}][v_{N+3}, v_{N+4}, v_{N+5}][v_{N+6}, v_{N+7}, v_{N+8}]$ may represent three different groups, each group of voltages being measured substantially simultaneously. In another embodiment, the groupings are arranged by an interdigitated method as in, for example, $[v_N, v_{N+3}, v_{N+6}][v_{N+1}, v_{N+4}, v_{N+7}][v_{N+2}, v_{N+5}, v_{N+8}]$. Additionally, the measurements may be made in groups defined randomly. Generating multiple delays in parallel increases the measurement speed. In addition, parallel measurement eliminates the need for a triggerable noise event. Moreover, parallel measurements enables measurement of multiple sampling points on the desired resolution.

A circuit to enable multiple measurements is now described with respect to FIG. 13. A circuit 1300 includes a noisy power area 1310 and a clean power area 1320. Inside the noisy power area 1310 is a probe 1312. The probe 1312 is coupled to a received clock signal, sampling_clock. Inside the clean power area 1320 is a delay line 1322, which may be controlled digitally. The delay line 1322 may include a number of inverters acting to delay the signal. The output of the delay line 1322 is coupled to a latch 1330, such as a flip-flop. Also coupled to the latches 1330 is the probe 1312. The number of latches 1330, according to one embodiment, matches the number of inverters in the delay line 1322. For meta-stability, additional latches 1340 may be coupled to the latches 1330 and the clock signal, sampling_clock.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" or "low" and logical "1" or "high" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An on-chip voltage sensor for measuring voltage fluctuation in a dynamic power supply of a chip, the on-chip voltage sensor comprising:
    an offset delay element that generates a delayed clock signal that is delayed by an amount of time relative to an internal reference clock signal of the chip;
    a probe circuit, coupled to a power supply rail of the chip, that receives the delayed clock signal and performs an operation to generate an output signal, wherein an amount of operational delay of the probe circuit in generating the output signal corresponds to voltage fluctuations on the power supply rail of the chip; and
    a sensor that compares the operational delay of the probe circuit in generating the output signal with a reference signal to determine voltage fluctuation present on the power supply rail during performance of the operation to generate the output signal.

2. The on-chip voltage sensor of claim 1 wherein said sensor produces a digital output that is statistically sampled.

3. The on-chip voltage sensor of claim wherein said probe circuit comprises stacked inverters.

4. The on-chip voltage sensor of claim 1 wherein the operation performed by the probe circuit to generate the output signal comprises inverting the delayed clock signal.

5. The on-chip voltage sensor of claim 1 further comprising:
    a pulse generator that receives the delayed clock signal and the output signal generated by the probe circuit, and generates a pulse signal having a width that corresponds to the operational delay of the probe circuit in generating the output signal.

6. The on-chip voltage sensor of claim 5 wherein the sensor comprises:
    a D flip-flop that receives the reference signal as its D signal and that receives the pulse signal as the flip-flop's clock signal.

7. The on-chip voltage sensor of claim 6 wherein when the reference signal is shorter than the width of the pulse signal, a first value is captured at a rising edge of the flip-flop's clock signal; and wherein when the reference signal exceeds the width of the pulse signal, a different value is captured at the rising edge of the flip-flop's clock signal.

8. The on-chip voltage sensor of claim 7 further comprising:
    a counter that counts a number of times, over a plurality of clock cycles that the reference signal exceeds the width of the pulse signal.

9. The on-chip voltage sensor of claim 8 wherein the number of times the reference signal exceeds the width of the pulse signal is used to form a corresponding cumulative distribution function (CDT).

10. The on-chip voltage sensor of claim 7 further comprising:
    a data collector that stores data describing when the reference signal exceeds the width of the pulse signal.

11. The on-chip voltage sensor of claim 10 wherein the data collector comprises a shift register that receives data and a memory device that stores data.

12. The on-chip voltage sensor of claim 11 wherein the data collector further comprises a data compressor that compresses data received at the shift register for storage in the memory device.

13. The on-chip voltage sensor of claim 1 further comprising a frequency divider coupled to the probe circuit, the frequency divider setting a time resolution.

14. The on-chip voltage sensor of claim 1 wherein the offset delay element generates multiple delayed clock signals.

15. The on-chip voltage sensor of claim 14 further comprising a plurality of latch circuits coupled to the multiple delayed clock signals and the output signal.

16. The on-chip voltage sensor of claim 15 further comprising additional latch circuits coupled to the plurality of latch circuits.

17. The on-chip voltage sensor of claim 1 incorporated into a device selected from a group consisting of a music player, a video player, an entertainment unit, a navigation device, a communications device, a personal digital assistant (PDA), a fixed location data unit, and a computer.

18. The on-chip voltage sensor of claim 1, in which the sensor is integrated into a semiconductor die.

19. An on-chip voltage sensor, comprising:
    means for generating a delayed clock signal;
    means for performing an operation to generate an output signal response to the delayed clock signal, the performing means being coupled to a power supply rail;
    means for determining voltage fluctuation present on the power supply rail.

20. The on-chip voltage sensor of claim 19 wherein the means for determining comprises means for comparing an output of the means for probing with a reference signal.

21. The on-chip voltage sensor of claim 20 further comprising:
    means for counting a number of times the reference signal exceeds a width of the output of the means for determining.

22. The on-chip voltage sensor of claim 20 further comprising: means for collecting data, from the means for determining.

23. The on-chip voltage sensor of claim 19, in which the sensor is integrated into a semiconductor die.

24. The on-chip voltage sensor of claim 19 wherein the sensor is integrated in an electronic device, selected from a group consisting of a set top box, music player, video player, entertainment unit, navigation device, communications device, personal digital assistant (PDA), fixed location data unit, and a computer, into which the integrated circuit is integrated.

* * * * *